US011264405B2

(12) United States Patent
Morrow et al.

(10) Patent No.: US 11,264,405 B2
(45) Date of Patent: Mar. 1, 2022

(54) SEMICONDUCTOR DIODES EMPLOYING BACK-SIDE SEMICONDUCTOR OR METAL

(71) Applicant: INTEL CORPORATION, Santa Clara, CA (US)

(72) Inventors: Patrick Morrow, Portland, OR (US); Rishabh Mehandru, Portland, OR (US); Nathan D. Jack, Forest Grove, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 16/082,260

(22) PCT Filed: Apr. 1, 2016

(86) PCT No.: PCT/US2016/025579
§ 371 (c)(1),
(2) Date: Sep. 4, 2018

(87) PCT Pub. No.: WO2017/171838
PCT Pub. Date: Oct. 5, 2017

(65) Prior Publication Data
US 2019/0096917 A1 Mar. 28, 2019

(51) Int. Cl.
H01L 27/12 (2006.01)
H01L 29/08 (2006.01)
(Continued)

(52) U.S. Cl.
CPC .... *H01L 27/1207* (2013.01); *H01L 21/76256* (2013.01); *H01L 21/84* (2013.01);
(Continued)

(58) Field of Classification Search
CPC . H01L 27/0629; H01L 29/785; H01L 29/861; H01L 29/66136; H01L 29/6609;
(Continued)

(56) References Cited

U.S. PATENT DOCUMENTS 5,616,944 A * 4/1997 Mizutani ............. H01L 27/0629
257/365
6,835,967 B2 12/2004 Yeo et al.
(Continued)

FOREIGN PATENT DOCUMENTS

| CN | 103227202 | 11/2015 |
| TW | 200419768 | 10/2004 |
| WO | 2004001801 | 12/2003 |

OTHER PUBLICATIONS

Notice of Allowance from Taiwanese Patent Application No. 106106095 dated Dec. 16, 2020, 3 pgs.
(Continued)

*Primary Examiner* — Marcos D. Pizarro
*Assistant Examiner* — Quinton A Brasfield
(74) *Attorney, Agent, or Firm* — Essential Patents Group, LLP

(57) ABSTRACT

Integrated circuit (IC) strata including one or more transistor and one or more semiconductor diode. A transistor may include one or more non-planar semiconductor bodies in which there is a channel region while the diode also includes one or more non-planar semiconductor bodies in which there is a p-type region, an n-type region, or both. One IC stratum may be only hundreds of nanometers in thickness and include both front-side and back-side interconnect levels. The front-side interconnect level is disposed over a front side of one or more of the non-planar semiconductor bodies and is coupled to at least one terminal of the transistor. The back-side interconnect level is disposed over a back side of one or more of the non-planar semiconductor bodies and is coupled to at least one terminal of the semiconductor diode.

12 Claims, 18 Drawing Sheets

(51) Int. Cl.
*H01L 29/739* (2006.01)
*H01L 29/06* (2006.01)
*H01L 29/66* (2006.01)
*H01L 29/165* (2006.01)
*H01L 27/02* (2006.01)
*H01L 29/861* (2006.01)
*H01L 27/06* (2006.01)
*H01L 49/02* (2006.01)
*H01L 21/762* (2006.01)
*H01L 21/84* (2006.01)
*H01L 23/00* (2006.01)
*H01L 29/786* (2006.01)
*H01L 29/20* (2006.01)
*H01L 29/205* (2006.01)

(52) U.S. Cl.
CPC .............. *H01L 24/03* (2013.01); *H01L 24/05* (2013.01); *H01L 24/13* (2013.01); *H01L 27/0255* (2013.01); *H01L 27/0629* (2013.01); *H01L 28/00* (2013.01); *H01L 29/06* (2013.01); *H01L 29/0657* (2013.01); *H01L 29/08* (2013.01); *H01L 29/165* (2013.01); *H01L 29/66356* (2013.01); *H01L 29/7391* (2013.01); *H01L 29/78603* (2013.01); *H01L 29/78606* (2013.01); *H01L 29/861* (2013.01); *H01L 29/20* (2013.01); *H01L 29/2003* (2013.01); *H01L 29/205* (2013.01)

(58) Field of Classification Search
CPC . H01L 27/1211; H01L 29/7391; H01L 22/14; H01L 23/528; H01L 23/53233; H01L 24/03; H01L 24/05; H01L 27/0924; H01L 27/1207; H01L 29/04; H01L 29/0696; H01L 29/0847; H01L 29/16; H01L 29/20
See application file for complete search history.

(56) References Cited

U.S. PATENT DOCUMENTS

| | | | |
|---|---|---|---|
| 8,735,993 | B2 | 5/2014 | Lo et al. |
| 9,076,772 | B2 | 7/2015 | Lee et al. |
| 9,799,647 | B1* | 10/2017 | Cheng ................ H01L 29/7827 |
| 2003/0201488 | A1 | 10/2003 | Nii |
| 2006/0226485 | A1 | 10/2006 | Arakawa |
| 2006/0273372 | A1* | 12/2006 | Voldman ............. H01L 27/0248 |
| | | | 257/308 |
| 2013/0037795 | A1 | 2/2013 | Sunamura et al. |
| 2013/0130479 | A1* | 5/2013 | Stuber ................ H01L 23/3677 |
| | | | 438/479 |
| 2014/0286085 | A1* | 9/2014 | Miyakawa ............... H02H 3/20 |
| | | | 365/158 |
| 2015/0126002 | A1 | 5/2015 | Arai et al. |
| 2017/0287900 | A1* | 10/2017 | Balakrishnan .... H01L 29/78642 |
| 2020/0035560 | A1* | 1/2020 | Block ................ H01L 27/1203 |

OTHER PUBLICATIONS

International Preliminary Report on Patentability from PCT/US2016/025579 dated Oct. 11, 2018, 11 pgs.
International Search Report and Written Opinion for PCT/US16/25579 dated Nov. 21, 2016, 14 pgs.
Office Action from Taiwan Patent Application No. 106106095 dated Aug. 17, 2020, 12 pgs.

* cited by examiner

SEMICONDUCTOR DIODES EMPLOYING BACK-SIDE SEMICONDUCTOR OR METAL

CLAIM OF PRIORITY

This Application is a National Stage Entry of, and claims priority to, PCT Application No. PCT/US2016/025579, filed on 1 Apr. 2016 and titled "SEMICONDUCTOR DIODES EMPLOYING BACK-SIDE SEMICONDUCTOR OR METAL", which is incorporated by reference in its entirety for all purposes.

BACKGROUND

Transistor cell density in integrated circuits (ICs) continues to increase. With the shrinking transistor cell footprint, vertical orientations are becoming popular. For example, non-planar transistors (e.g., finFET) employ a semiconductor body (e.g., fin) having vertically-oriented sidewalls.

Often an IC includes semiconductor diodes (e.g., P-type/N-type, or p-n, junctions), some of which need to have large current carrying capability (e.g., an ESD protection diode). Historically, such semiconductor diodes have incorporated planar doped wells within a bulk semiconductor. Bulk semiconductor regions are becoming less available as the density of non-planar semiconductor bodies increases. Even if density were to be sacrificed, the integration of planar semiconductor diode regions and non-planar semiconductor transistor regions is difficult. Efforts to employ non-planar semiconductor bodies for the alternate purpose of diode fabrication have thus far been lacking, for example displaying poor current carrying capabilities that are too low for many applications, such as ESD protection diode.

Diode architectures, and techniques for manufacturing such diodes, that are compatible with non-planar semiconductor bodies and advances in vertical device integration are therefore advantageous.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1:
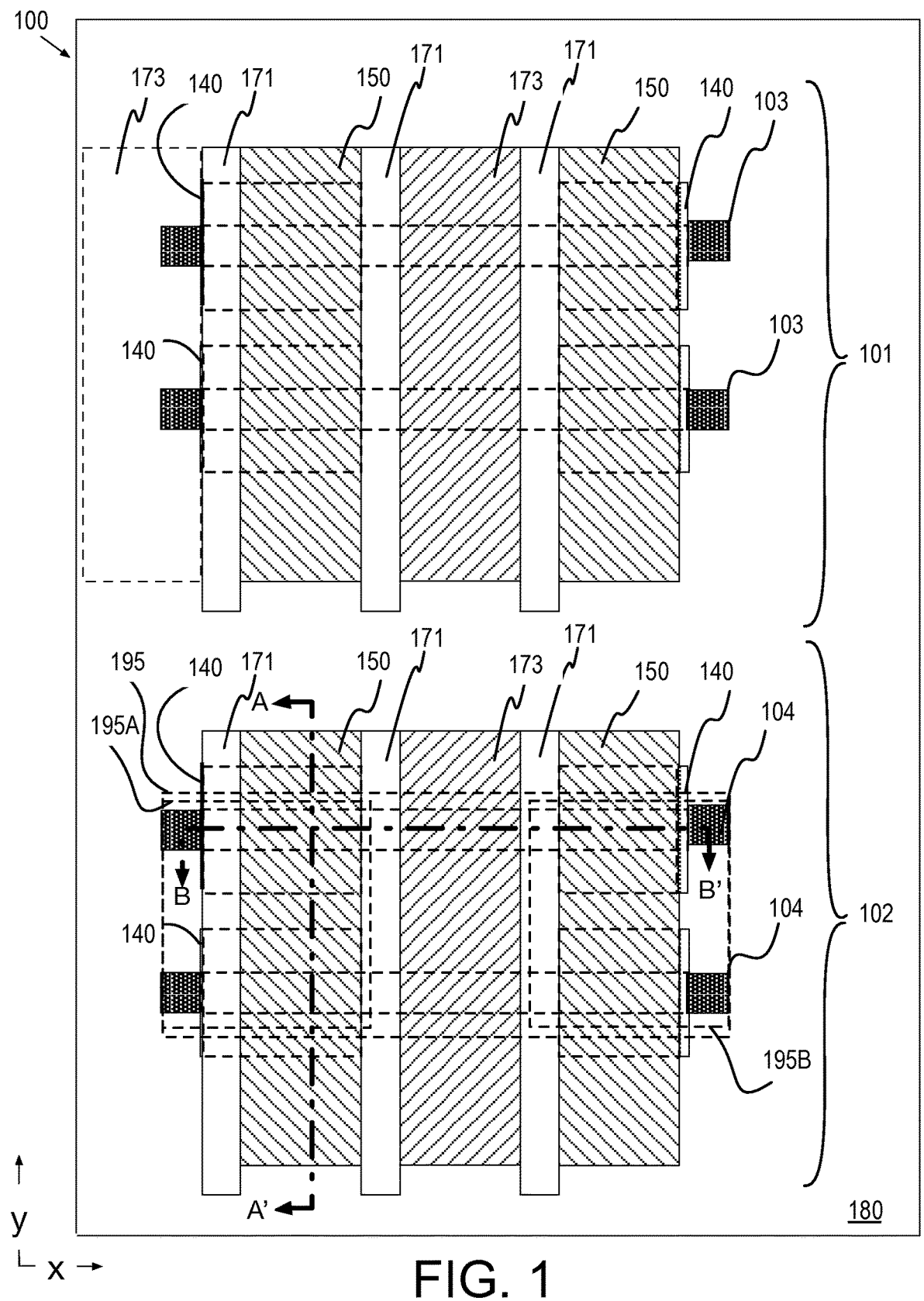
FIG. 1 is a plan view of a IC including a FET and a diode, in accordance with some embodiments.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that embodiments may be practiced without these specific details. In some instances, well-known methods and devices are shown in block diagram form, rather than in detail, to avoid obscuring the embodiments. Reference throughout this specification to "an embodiment" or "one embodiment" or "some embodiments" means that a particular feature, structure, function, or characteristic described in connection with the embodiment is included in at least one embodiment. Thus, the appearances of the phrase "in an embodiment" or "in one embodiment" or "some embodiments" in various places throughout this specification are not necessarily referring to the same embodiment. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or"

as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause and effect relationship).

The terms "over," "under," "between," and "on" as used herein refer to a relative position of one component or material with respect to other components or materials where such physical relationships are noteworthy. For example in the context of materials, one material or material disposed over or under another may be directly in contact or may have one or more intervening materials. Moreover, one material disposed between two materials or materials may be directly in contact with the two layers or may have one or more intervening layers. In contrast, a first material or material "on" a second material or material is in direct contact with that second material/material. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Described herein are IC strata including one or more transistors and one or more semiconductor diodes. The diode may be an ESD protection diode within the IC, for example. In some exemplary embodiments, a transistor includes one or more non-planar semiconductor bodies in which there is a channel region. The diode also includes one or more non-planar semiconductor bodies in which there is a p-type region, an n-type region, or both. One IC stratum may be very thin, for example on the order of a few hundred nanometers, or less, and include both front-side and back-side interconnect levels. The front-side interconnect level is disposed over a front side of at least some of the non-planar semiconductor bodies and is coupled to at least one transistor terminal. In some embodiments, the front-side interconnect level is also coupled to at least one terminal of a diode. The back-side interconnect level is disposed over a back side of at least some of the non-planar semiconductor bodies and is coupled to at least one diode terminal. In some embodiments, the back-side interconnect level is also coupled to at least one terminal of a transistor.

Because the non-planar semiconductor bodies may be within a stratum that is very thin, for example on the order of hundreds of nanometers, the absence of bulk semiconductor may pose a challenge in the fabrication of semiconductor diodes having sufficiently high current carrying capability for all IC applications. In some embodiments herein, a plurality of non-planar semiconductor bodies having a geometry suitable for field effect transistors (FETs) are doped to be operative as one or both sides of a p-n junction diode. The bodies are then interconnected through the use of one or more of doped-semiconductor and metallization formed on the back side of the bodies. This back-side diode interconnect may facilitate greater diode architectures having greater current carrying capability, and also allow for the front side of a diode to be fabricated in substantially the same manner as the front-side of a transistor. For example, the semiconductor diode may include a gate stack and front side contacts, either of which may be non-operative in the context of the p-n junction diode.

FIG. 1 is a plan view of an IC 100 including field effect transistor (FET) 101 and a semiconductor junction diode 102, in accordance with some embodiments. In FIG. 1, solid lines denote salient materials forming a top-side surface of an IC stratum while dashed lines denote salient material interfaces within the stratum that are disposed below another overlying material, or are present on a back-side of the IC stratum. Heavy dot-dashed lines denote planes through a transverse width (A-A') and longitudinal length (B-B') of the semiconductor bodies for which cross-sectional views are further provided elsewhere herein.

FET 101 includes one or more semiconductor bodies 103 that are embedded within isolation material 180. FET 101 further includes a gate electrode 173 strapping across a channel region of each of semiconductor bodies 103. Although two semiconductor bodies 103 are illustrated in FIG. 1, a FET may include one semiconductor body, or more than two semiconductor bodies. Semiconductor bodies 103 may have any semiconductor composition known to be suitable for a field effect transistor, such as, but not limited to, group IV materials (e.g., Si, Ge, SiGe), group III-V materials (e.g., GaAs, InGaAs, InAs, InP), or group III-N materials (e.g., GaN, AlGaN, InGaN). In some advantageous embodiments, semiconductor bodies 103 are monocrystalline.

Front-side contact metallization 150 is disposed on adjacent sides of gate electrode 173 and also extends across semiconductor bodies 103. In the illustrated embodiment, front-side contact metallization 150 is disposed on raised, doped-semiconductor terminals 140, which are further on direct contact with semiconductor bodies 103. Doped-semiconductor terminals 140 may be heavily-doped with electrically active impurities imparting n-type or p-type conductivity. For exemplary source/drain embodiments, the doped-semiconductor terminals 140 are doped to the same conductivity type (e.g., n-type for NMOS and p-type for PMOS). In alternative embodiments (e.g., for a tunneling FET), the doped-semiconductor terminals 140 may be doped complementarily. Doped-semiconductor terminals 140 may be any semiconductor material compatible with semiconductor bodies 103, such as group IV materials (e.g., Si, Ge, SiGe), and/or group III-V materials (e.g., InGaAs, InAs). In some embodiments, terminals 140 are of the same semiconductor as semiconductor bodies 103. In other embodiments, terminals 140 are of a different semiconductor than semiconductor bodies 103, forming a heterojunction.

An electrically insulating dielectric spacer 171 laterally separates gate electrode 173 from front-side contact metallization 150 and/or doped-semiconductor terminals 140. Front-side contact metallization 150 may include one or more metals, such as to Ti, W, Pt, their alloys, and nitrides, that form an ohmic or tunneling junction with doped-semiconductor terminals 140. Dielectric spacer 171 may be or any conventional dielectric such as, but not limited to, silicon dioxide, silicon nitride, or silicon oxynitride. Dielectric spacer 171 may also be any known low-k material having a relative permittivity below 4.0. Although only one gate electrode 173 is illustrated in solid line as being part of a single logic cell, an exemplary second gate electrode 173 is drawn in dashed line as being associated with an adjacent cell.

As further illustrated in FIG. 1, semiconductor diode 102 includes one or more semiconductor bodies 104 that are also embedded within isolation material 180. Semiconductor bodies 104 may also have any semiconductor composition known to be suitable for one or both sides of a p-n semiconductor diode, such as, but not limited to, group IV materials (e.g., Si, Ge, SiGe), group III-V materials (e.g., GaAs, InGaAs, InAs, InP), or group III-N materials (e.g., GaN, AlGaN, InGaN). In some advantageous embodiments, semiconductor bodies 104 are monocrystalline. In some embodiments, semiconductor bodies 104 have substantially the same non-planar geometry as semiconductor bodies 103. For example, semiconductor bodies 103 and 104 may be semiconductor fins having a same transverse width (e.g., y-dimension), a same longitudinal length (e.g., x-dimension), and vertical height (e.g., z-dimension). With the same non-planar body geometry, integration of semiconductor diode 102 with FET 101 may be simplified. For example, allowing front-side processing of semiconductor diode 102 to be very similar to that of FET 101 so that the diode and transistor may be fabricated concurrently in adjacent regions of the IC stratum.

In some embodiments represented by FIG. 1, semiconductor diode 102 further includes a gate stack that includes gate electrode 173 strapping across a center region of each of semiconductor bodies 104. Although gate electrode 173 in the context of diode 102 may be unbiased during operation of IC 100, gate electrode 173 may nevertheless be present as a structural artifact indicative of diode 102 being exposed to substantially the same front-side processing as FET 101. As for FET 101, dielectric spacer 171 laterally separates gate electrode 173 from front-side metallization 150 and/or doped-semiconductor terminals 140. In some embodiments, doped-semiconductor terminals 140 are functional as terminals of diode 102. In other embodiments that rely exclusively on backside diode interconnection, doped-semiconductor terminals 140 and/or front-side metallization 150 may be unbiased during operation of IC 100 and merely present as structural artifacts indicative of diode 102 being exposed to substantially the same front-side processing as FET 101.

As further illustrated with dashed-line in FIG. 1, semiconductor diode 102 includes back-side diode interconnect 195 that interconnects at least the two semiconductor bodies 104 into a large-format diode having a current-carrying width that is a function of the longitudinal length of semiconductor bodies 104. Alternatively, semiconductor diode 102 includes backside diode interconnects 195A and 195B that interconnect two ends of at least the two semiconductor bodies 104 into a large-format diode having a current-carrying width that is a function of the number of semiconductor bodies interconnected in electrical parallel. To further illustrate these alternate embodiments, cross-sectional views along the A-A' plane and B-B' plane denoted in heavy dot-dash in FIG. 1 are further described below for some exemplary fabrication methods and resulting device architectures.

Figure 2:
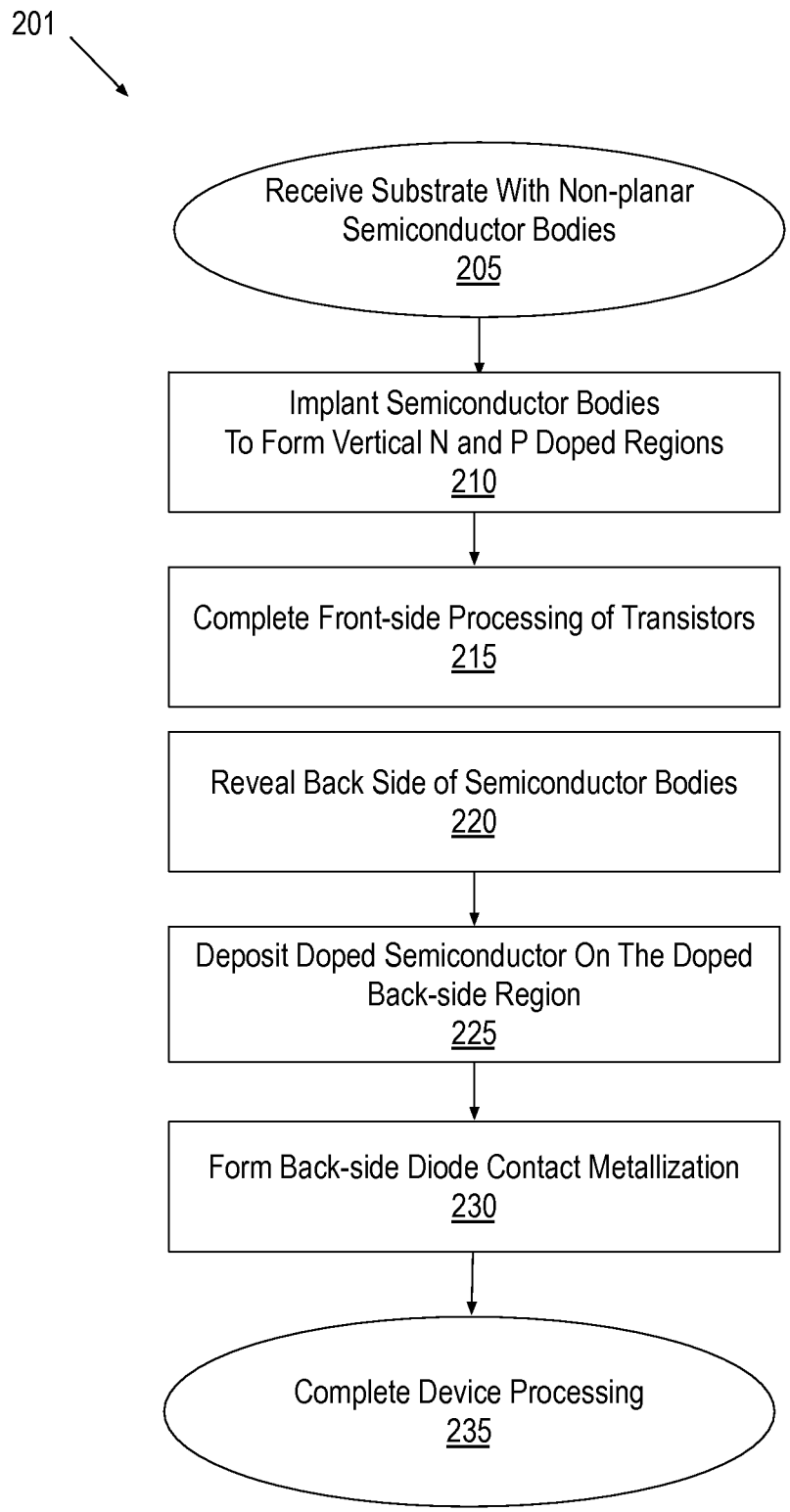
FIG. 2 is a flow diagram of methods for fabricating an IC, in accordance with some embodiments.

FIG. 2 is a flow diagram of methods 201 for fabricating IC 100, in accordance with some embodiments. FIGS. 3A, 3B, 3C, 3D, and 3E are cross-sectional views of a diode along the A-A' plane denoted in FIG. 1 following the performance of selected operations of the methods 201, in accordance with some embodiments. Referring first to FIG. 2, methods 201 begin at operation 205 where a substrate, over which non-planar semiconductor bodies have been fabricated, is received as an input. Any known technique for preparing non-planar semiconductor bodies (e.g., fins) suitable for the fabrication of FETs (e.g., finFETs) may be employed upstream of methods 201. The substrate received at operation 205 may be one or more materials from which the non-planar semiconductor bodies were derived. In exemplary embodiments further illustrated by FIG. 3A, diode 102 includes semiconductor bodies 104 having a vertical semiconductor body (e.g., fin) z-height $H_f$ are disposed over a back-side substrate 305. Similar semiconductor bodies would be present for an adjacent transistor (not depicted in FIG. 3A). Substrate 305 may be a crystalline semiconductor substrate (e.g., Si) from which semiconductor bodies 104 were formed. For example, in some silicon-based embodiments, back-side substrate 305 is a crystalline group IV substrate, such as Si. For some group III-V-channeled transistor embodiments, back-side substrate 305 may be a crystalline III-V material, such as GaAs.

Returning to FIG. 2, at operation 210 impurity dopants are implanted into the diode's semiconductor bodies, forming a vertically-oriented p-type and n-type doped regions. As further illustrated in FIG. 3A, a back-side semiconductor body portion 104B is implanted with any known impurity species to have a first conductivity type (e.g., p-type). Any dopant level may be employed as desired for a given p-n junction characteristic. In the exemplary embodiment, back-side semiconductor body portion 104B having a z-height of $H_{sf}$ is doped to a light-to-moderate "p-" doping level. A front-side semiconductor body portion 104A is further implanted with any known impurity species so that it has the complementary conductivity type (e.g., n-type). Any dopant level may be employed as desired for a given p-n junction characteristic. In the exemplary embodiment, front-side semiconductor body portion 104A is doped to a light-to-moderate "n-" doping level. Any implantation technique known in the art to be suitable for forming a vertical dopant profile within the z-height $H_f$ may be employed. In some embodiments where $H_f$ is between 50 and 500 nm, shallow implant techniques may be employed to implant both the p-type and n-type impurities into semiconductor bodies 104 from a front side while bodies 104 are disposed on back-side substrate 305. In some alternative embodiments, only the front-side semiconductor body portion 104A is implanted with impurities from the front side while bodies 104 are disposed on back-side substrate 305.

Returning to FIG. 2, front-side processing of transistors is completed at operation 215. Operation 215 may entail any known techniques for fabricating a FET gate stack and source/drain doped-semiconductor terminals. For example, a gate stack including a gate electrode on a gate dielectric may be formed over channel portions of semiconductor bodies of a transistor. The same gate stack may also be formed over semiconductor bodies of a semiconductor diode. Alternatively, semiconductor bodies of the diode may be masked during one or more of the front-side transistor processing operations. While any gate stack materials known to be suitable for semiconductor bodies may be utilized at operation 215, in some exemplary embodiments the gate stack includes a high-k dielectric material (with a bulk relative permittivity greater than 9) and a metal gate electrode having a work function suitable for the semiconductor bodies. Exemplary high-k materials include metal oxides, such as, but not limited to $Al_2O_3$, $HfO_2$, $HfAlO_x$. Silicates, such as, but not limited to $HfSiO_x$, or $TaSiO_x$ may also be suitable for some semiconductor body compositions (e.g., Si, Ge, SiGe, III-V). The gate electrode may advantageously have a work function below 5 eV and may include an elemental metal layer, a metal alloy layer, or laminate structure of either or both. In some embodiments the gate electrode is a metal nitride, such as TiN (e.g., 4.0-4.7 eV). The gate electrode may also comprise Al (e.g., TiAlN). Other alloy constituents may also be employed in the gate electrode, such as, but not limited to, C, Ta, W, Pt, and Sn.

Figure 3A:
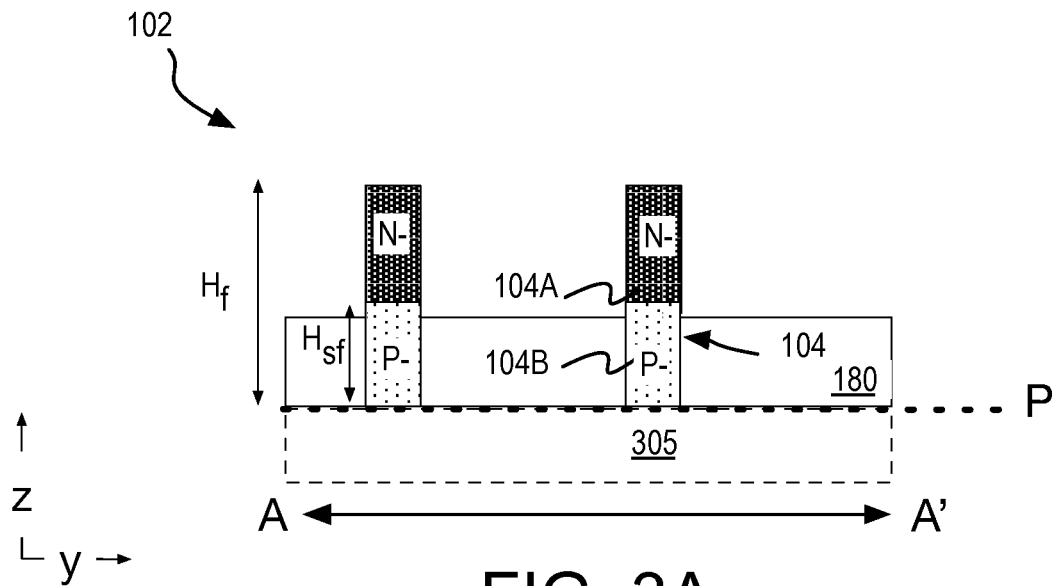
FIGS. 3A, 3B, 3C, 3D, and 3E are cross-sectional views of a diode along the A-A' plane denoted in FIG. 1 following the performance of selected operations of the methods illustrated in FIG. 2, in accordance with some embodiments.
Figure 3B:
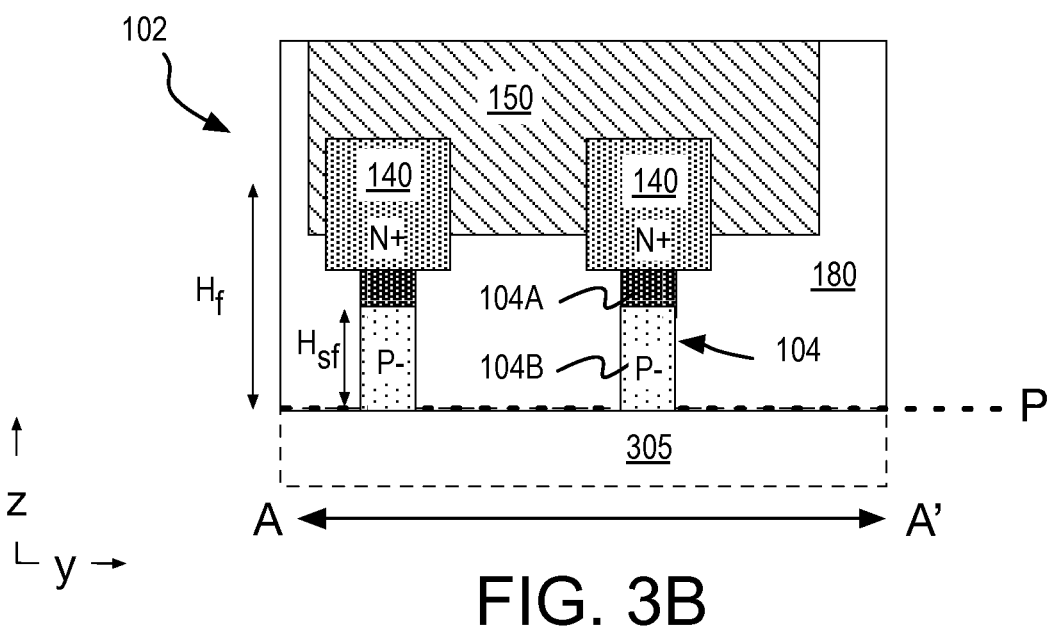
Figure 3C:
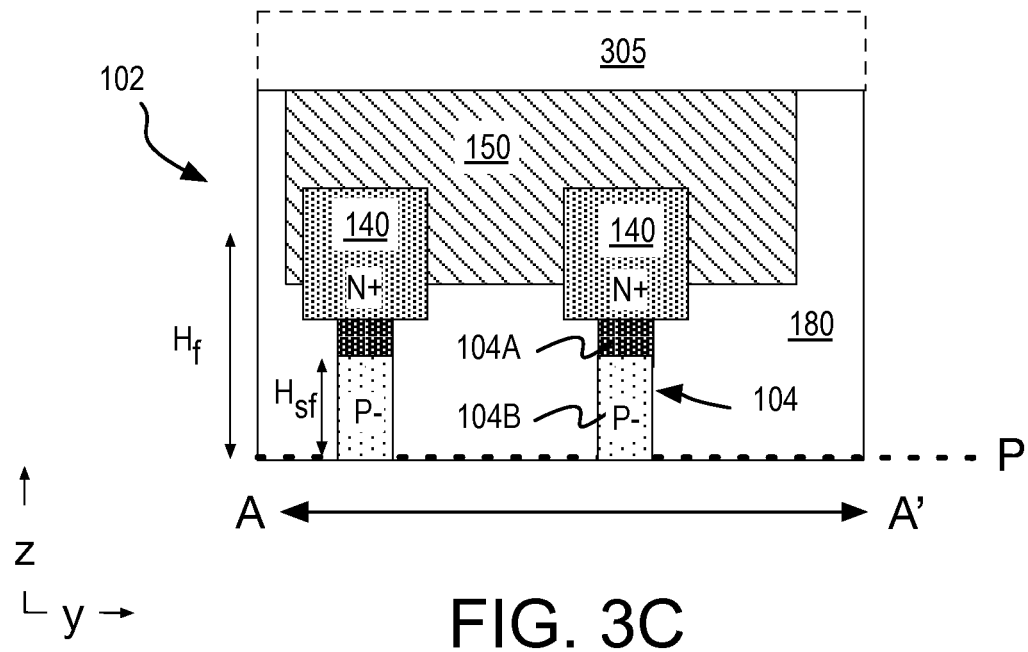
Figure 3D:
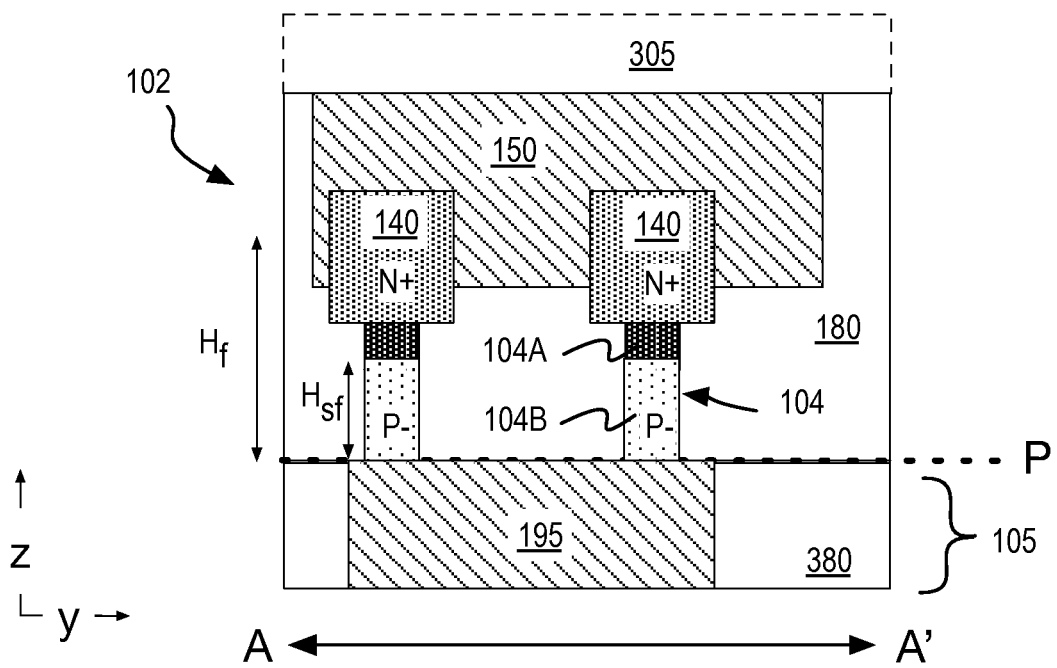
Figure 3E:
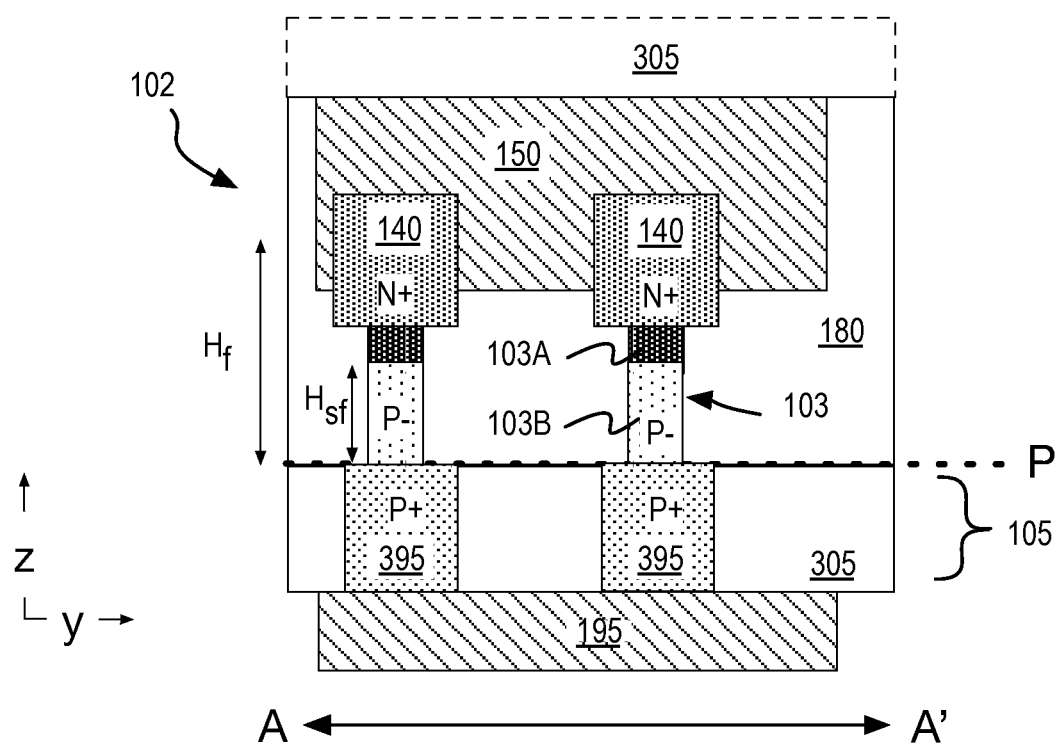

In further embodiments, operation 215 also entails formation of doped-semiconductor terminals and front-side contact metallization. The doped-semiconductor terminals may be formed with any known impurity implantation process and/or epitaxial regrowth process. The doped-semiconductor terminals formed at operation 215 include source and drain regions of the transistor. In further embodiments, a diode terminal to one of the p-type and n-type regions of the diode is further formed at operation 215. In some exemplary embodiments illustrated in FIG. 3B, heavily-doped (n+) semiconductor terminal 140 is formed on front-side semiconductor body portions 104A. In some exemplary embodiments, heavily-doped (n+) semiconductor terminal 140 is epitaxially grown on one or more surface of semiconductor bodies 104. Front-side contact metallization 150 is then formed, for example in direct contact with the doped-semiconductor terminals. Both the transistor source/drain terminals and a diode terminal may be directly contacted by front-side contact metallization 150. Contact metallization 150 may be any metal known to be suitable for the purpose and may be deposited by any known technique. As shown in FIG. 1 and FIG. 3B, front-side contact metallization 150 straps across the plurality of semiconductor bodies 104, coupling one side of the p-n junction formed in each semiconductor body 104 into electrical parallel. Following the formation of front-side contact metallization, front-end processing of transistor and diodes is substantially complete. Any conventional backend interconnect fabrication may then be practiced to complete a front-side of the IC stratum.

Returning to FIG. 2, methods 201 continue to operation 220 where the backside of the non-planar semiconductor bodies is revealed. In some embodiments further illustrated in FIG. 3C, a front-side stack 305 including any suitable carrier may be applied (e.g., bonded) to the uppermost front-side interconnect level. With the front side of the IC stratum mechanically supported, back-side substrate 305 may then be thinned into a back-side stack 105 and/or replaced with back-side stack 105. Any known grind, and/or polish, and/or layer transfer process may be applied at operation 220. Once revealed, the back side of the semiconductor bodies of at least diode 102 are ready for back-side processing. Returning to FIG. 2, backside processing may includes deposition of doped semiconductor material on the back-side at operation 225, and forming back-side contact metallization to the diode at operation 230. Methods 201 then end at operation 235 where the IC device processing is completed following any known techniques.

In some embodiments where only the front-side semiconductor body portion was implanted with impurities from the front side, back-side semiconductor body portion may now be implanted with impurities from the back side. In the exemplary embodiment further illustrated in FIG. 3D, back-side stack 105 includes a dielectric material 380 and back-side diode interconnect 195 in contact with each back-side semiconductor body portion 103B. In some embodiments, back-side interconnect 195 includes only a back-side contact metallization that completes a second diode terminal interconnecting the plurality of semiconductor bodies 104. In some alternative embodiments further illustrated in FIG. 3E, back-side stack 105 further includes heavily-doped semiconductor 395. Heavily-doped semiconductor 395 may be doped to the same conductivity type as the back-side semiconductor body portions 104B (e.g., p+) to interface back-side contact metallization to back-side semiconductor body portions 104B. Such embodiments may advantageously reduce the semiconductor diode contact resistance. For some embodiments represented by FIG. 3E, heavily-doped semiconductor 395 spans the entire longitudinal length of semiconductor bodies 104 (e.g., x-dimension), but is only grown on the backside surface of semiconductor bodies 104. For such embodiments, heavily-doped semiconductor 395 may be monocrystalline material epitaxially grown by any known technique (e.g., MBE, MOCVD, etc.). The epitaxial semiconductor material may be the same semiconductor as that of semiconductor body (e.g., Si for a Si body) to avoid formation of a heterojunction. Back-side diode interconnect 195 is then deposited in contact with each region of heavily-doped semiconductor 395. In other embodiments, heavily-doped semiconductor 395 spans the entire distance (e.g., y-dimension) between the plurality of semiconductor bodies 104 and also spans the entire longitudinal length of semiconductor bodies 104 (e.g., x-dimension). For such embodiments, back-side diode interconnect 195 includes both back-side contact metallization and heavily-doped semiconductor 395. The large region of heavily-doped semiconductor 395 may be polycrystalline material deposited from the backside with any known technique (e.g., CVD).

Figure 4:
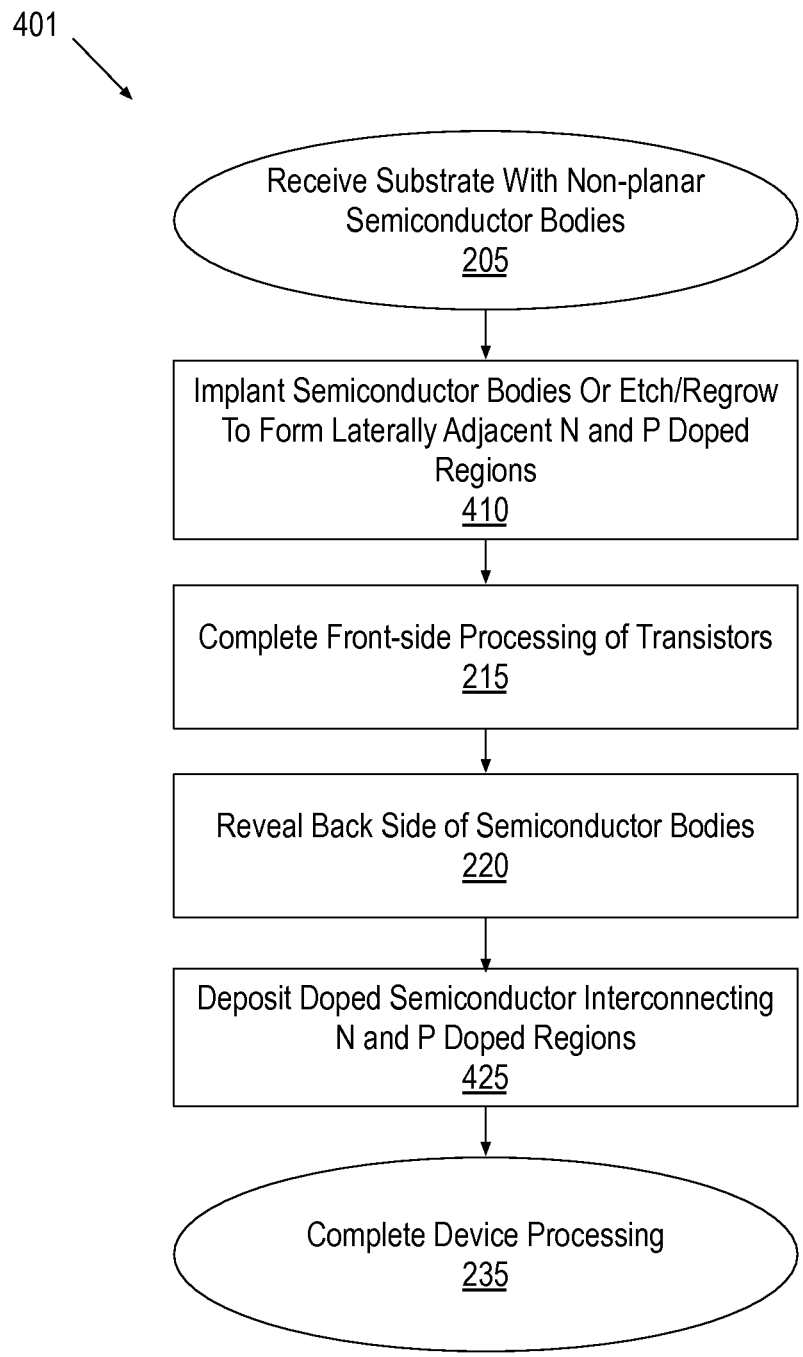
FIG. 4 is a flow diagram of methods for fabricating an IC, in accordance with some alternative embodiments.

FIG. 4 is a flow diagram of methods 401 for fabricating IC 100, in accordance with some alternative embodiments. FIGS. 5A, 5B, 5C, 5D, and 5E are cross-sectional views of a diode along the B-B' plane denoted in FIG. 1 following the performance of selected operations of the methods 401, in accordance with some embodiments. Referring first to FIG. 4, methods 401 begin at operation 205 where a substrate, upon which non-planar semiconductor bodies have been fabricated, is received as an input. Any of the non-planar semiconductor bodies described above in the context of methods 201 may be received as input to methods 401. At operation 410, semiconductor bodies to be employed in a diode are implanted with impurity species, for example using any ion implantation techniques known in the art, to form n-type and p-type semiconductor regions within opposite ends of the semiconductor body. Alternatively, end portions of semiconductor bodies to be employed in a diode are regrown, for example using any semiconductor epitaxy techniques known in the art, to form the n-type and p-type semiconductor regions. Hence, rather than forming a vertical p-n junction within the non-planar semiconductor bodies as was done at operation 210 (FIG. 2), laterally-spaced p-type and n-type regions are formed within the non-planar semiconductor bodies.

Figure 5A:
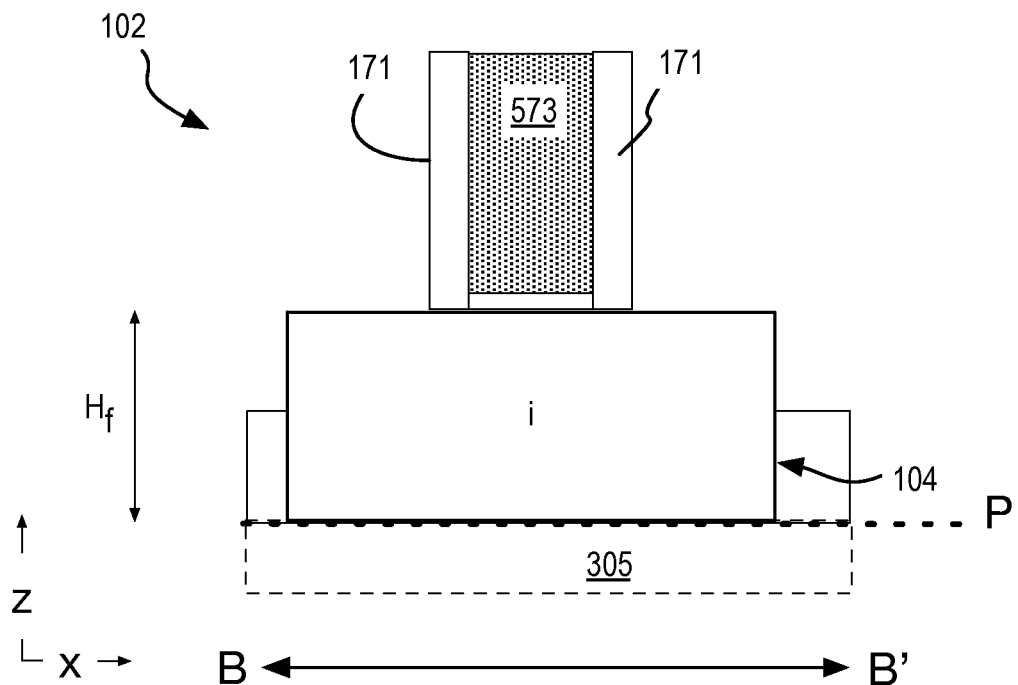
FIGS. 5A, 5B, 5C, 5D, and 5E are cross-sectional views of a diode along the B-B' plane denoted in FIG. 1 following the performance of selected operations of the methods illustrated in FIG. 4, in accordance with some embodiments.
Figure 5B:
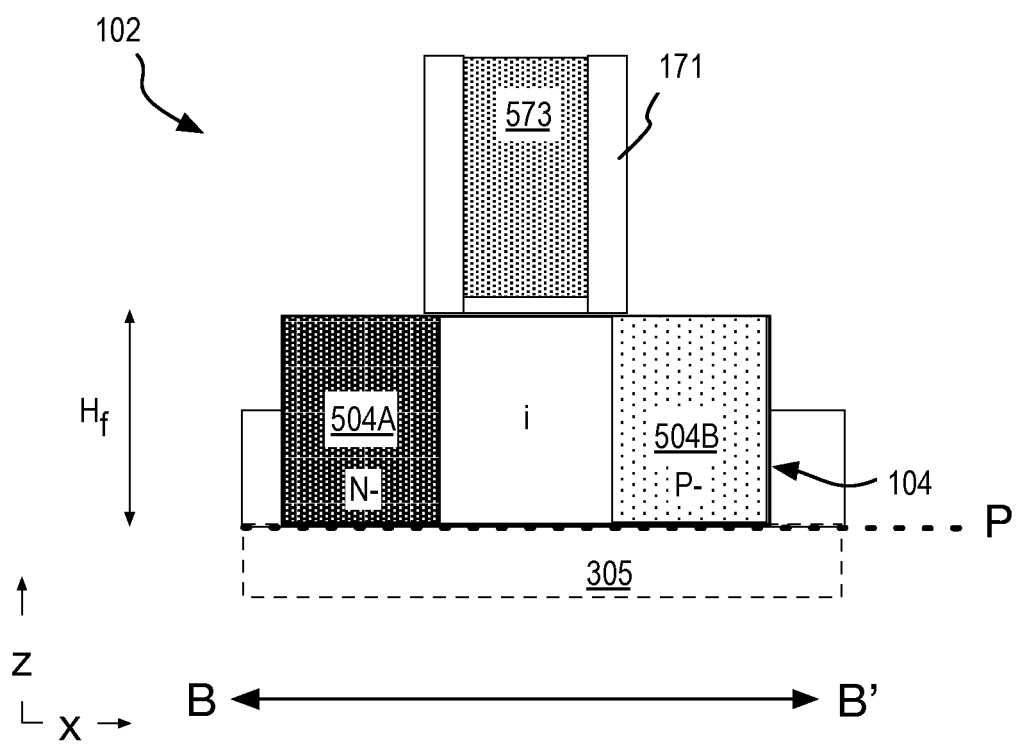
Figure 5C:
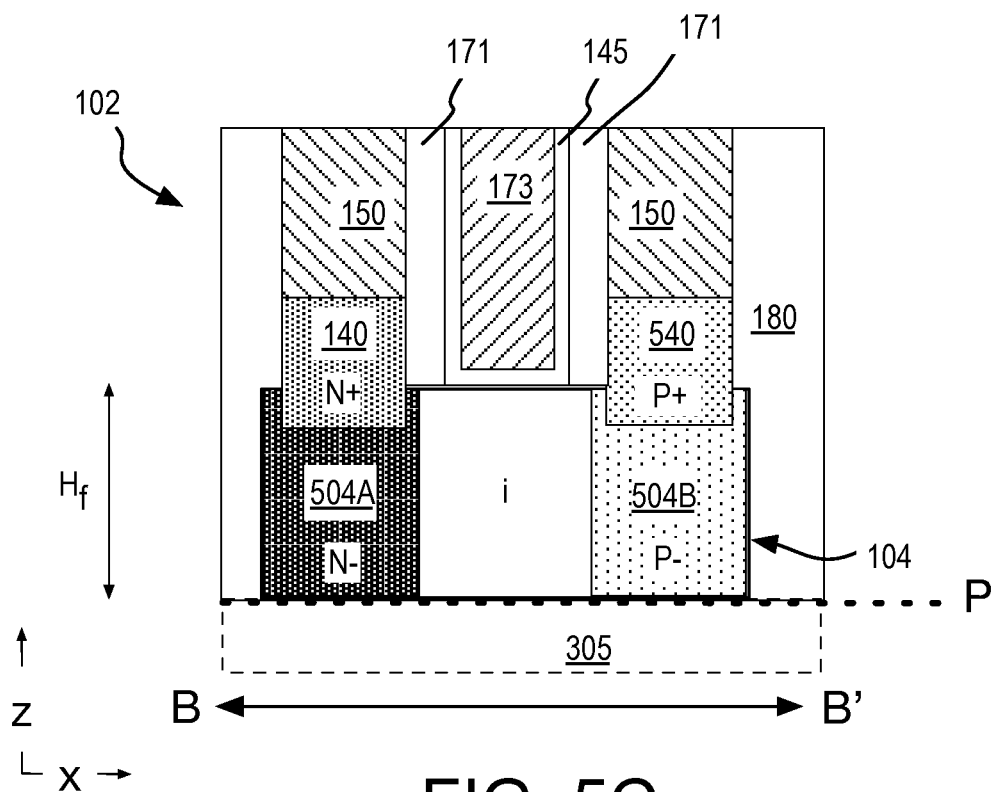
Figure 5D:
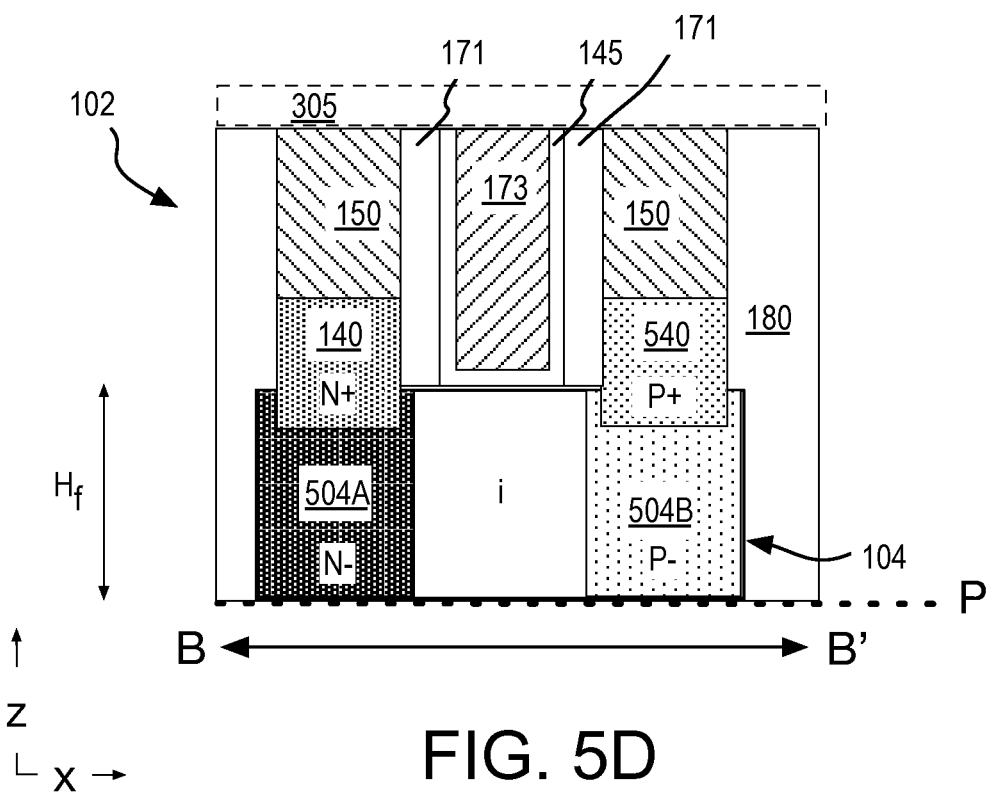
Figure 5E:
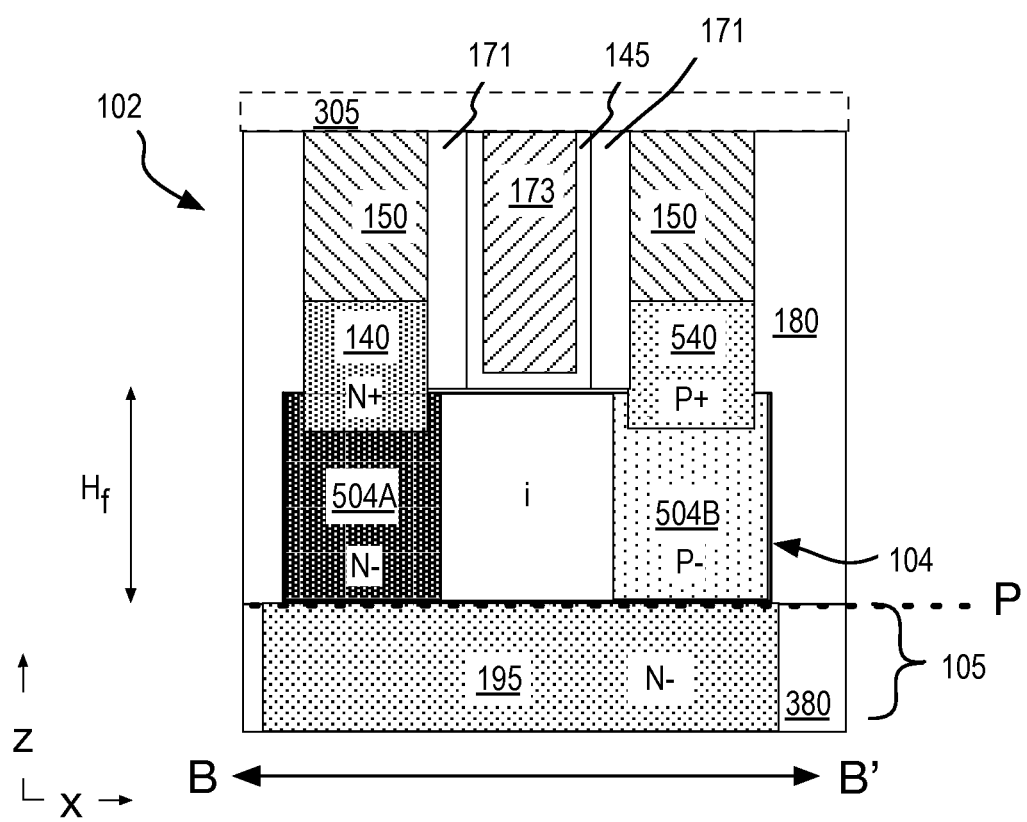

In some embodiments further illustrated by FIGS. 5A and 5B, a gate stack is formed over a central portion of semiconductor body 104 prior to forming doped diode regions. For the illustrated embodiments, the gate stack is a mandrel including a sacrificial gate electrode 573, which may be a dielectric or polysilicon, for example. Spacer 171 is disposed on a sidewall of sacrificial gate electrode 573. End portions of semiconductor bodies not protected by the gate stack are then doped complimentarily. In some embodiments, exposed ends of a semiconductor body are ion implanted from the front side while semiconductor body 104 is disposed over back-side substrate 305. For example, a first species may be implanted in a first end of the semiconductor body to form an n-type or p-type region, and then a second implant species may be implanted to form the complementary region at the opposite end of the semiconductor body. One or two masking operations (not depicted) may be needed to selectively implant one or both ends of the semiconductor bodies.

As shown in FIG. 5B, doped end lengths 504A (e.g., n−) and 504B (e.g., p−) extend through the entire semiconductor body height $H_f$ to intersect plane P. In alternative embodiments where n-type and p-type end lengths are epitaxially grown on surfaces of semiconductor body 104, the epitaxial end lengths wrap around a sidewall of semiconductor body 104 to intersect plane P. Doped end lengths 504A, 504B may be separated by an intrinsic (i) region protected by the gate stack, which is not doped as heavily as end lengths 504A, 504B. The front-side processing illustrated in FIG. 5B may therefore generate a lateral p-i-n structure rather than a p-n junction.

Returning to FIG. 4, methods 401 continue at operation 215 where front-side processing of the transistors is completed. Such processing may be substantially as described above in the context of methods 201. Operation 215 may entail any known techniques for fabricating a FET gate stack and source/drain doped-semiconductor terminals. Concurrently with transistor gate stack fabrication, a gate stack including gate dielectric and a gate electrode may also be formed over semiconductor bodies of a semiconductor diode. For example, a sacrificial gate stack may be replaced with the permanent gate stack. Alternatively, semiconductor bodies of the diode may be masked during one or more of the front-side transistor processing operations so that the sacrificial gate stack is retained as permanent feature of the diode, or such that no gate stack is formed over diode semiconductor bodies.

While any gate stack materials known to be suitable for semiconductor bodies may be utilized at operation 215, in some exemplary embodiments the gate stack includes a high-k dielectric material (with a bulk relative permittivity greater than 9) and a metal gate electrode having a work function suitable for semiconductor bodies. Exemplary high-k materials include metal oxides, such as, but not limited to $Al_2O_3$, $HfO_2$, $HfAlO_x$. Silicates, such as, but not limited to $HfSiO_x$, or $TaSiO_x$ may also be suitable for some semiconductor body compositions (e.g., Si, Ge, SiGe, III-V). The gate electrode may advantageously have a work function below 5 eV and may include an elemental metal layer, a metal alloy layer, or laminate structure of either or both. In some embodiments the gate electrode is a metal nitride, such as TiN (e.g., 4.0-4.7 eV). The gate electrode may also comprise Al (e.g., TiAlN). Other alloy constituents may also be employed in the gate electrode, such as, but not limited to, C, Ta, W, Pt, and Sn.

In further embodiments, operation 215 also entails formation of doped-semiconductor terminals and front-side contact metallization. The doped-semiconductor terminals may be formed with any known impurity implantation process and/or epitaxial regrowth process. The doped-semiconductor terminals formed at operation 215 include source and drain regions of the transistor. In further embodiments, front-side diode terminals to each of the p-type and n-type regions of the diode are also formed at operation 215. In some exemplary embodiments illustrated in FIG. 5C, heavily-doped (n+) semiconductor 140 is formed on a first doped end length 504A and heavily-doped (p+) semiconductor 540 is formed on a second doped end length 504B. In some exemplary embodiments, heavily-doped semiconductor 140, 540 is epitaxially grown on one or more surface of each semiconductor body 104. Front-side contact metallization 150 is then formed, for example in direct contact with doped-semiconductor terminals 140. Both the transistor source/drain terminals and the diode terminals may be directly contacted by contact metallization 150. In some exemplary embodiments, front-side contact metallization 150 extends between a source or drain terminal of a transistor and a diode terminal, interconnecting the two. Contact metallization 150 may be any metal known to be suitable for the purpose and may be deposited by any known technique. As shown in FIG. 1 front-side contact metallization 150 straps across the plurality of semiconductor bodies 104, coupling one side of the p-n junction formed in each semiconductor body 104 in electrical parallel. Following front-side contact metallization, front-end processing of transistor and diodes is substantially complete. Any conventional backend interconnect fabrication may then be practiced to complete a front-side of the IC stratum.

Returning to FIG. 4, methods 401 continue to operation 220 where the backside of the non-planar semiconductor bodies is revealed. In some embodiments further illustrated in FIG. 5D, front-side stack 305 including any suitable carrier may be applied (e.g., bonded) to the uppermost front-side interconnect level. With the front side of the IC stratum mechanically supported, back-side substrate 305 may then be thinned into back-side stack 105 and/or replaced with back-side stack 105. Any known grind, and/or polish, and/or layer transfer process may be performed at operation 220. Once revealed, the back side of the semiconductor bodies of at least diode 102 are ready for back-side processing.

Methods 401 (FIG. 4) continue at operation 425 where doped semiconductor is deposited on the backside of the diode semiconductor body to interconnect the n-type and p-type end portions formed from the front-side processing. In the exemplary embodiment further illustrated in FIG. 5E, back-side stack 105 formed at operation 425 includes a dielectric material 380 and back-side diode interconnect 195 that is in contact with a back-side of both doped semiconductor body end lengths 504A, 504B. In some exemplary embodiments, back-side diode interconnect 195 includes single-crystalline semiconductor that is epitaxially grown from the backside of semiconductor body 104. The epitaxial semiconductor material advantageously extends over the entire longitudinal length of semiconductor body 104 and is in direct contact with both end lengths 504A, 504B. The epitaxial semiconductor material may be the same semiconductor as that of semiconductor body (e.g., Si) to avoid formation of a heterojunction. The epitaxial semiconductor material may be doped to either conductivity type such that the p-n junction is either at the interface of end length 504A or end length 504B (illustrated). Back-side diode interconnect 195 therefore wraps the diode structure around any portion of semiconductor body 104 that laterally separates the p-type and n-type regions. For example, back-side diode interconnect 195 may shunt the intrinsic semiconductor region disposed below any vestigial gate stack. Methods 401 (FIG. 4) then end at operation 235 where the IC device processing is completed following any known techniques.

Figure 6A:
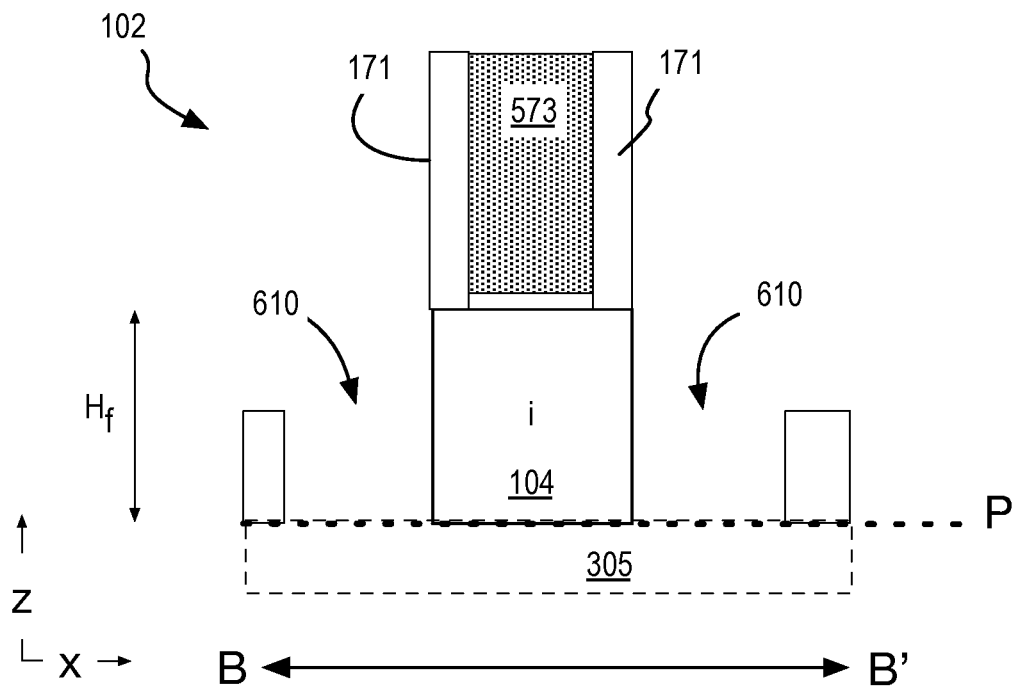
FIGS. 6A, 6B, 6C, 6D, and 6E are cross-sectional views of a diode along the B-B' plane denoted in FIG. 1 following the performance of selected operations of the methods illustrated in FIG. 4, in accordance with some alternative embodiments.
Figure 6B:
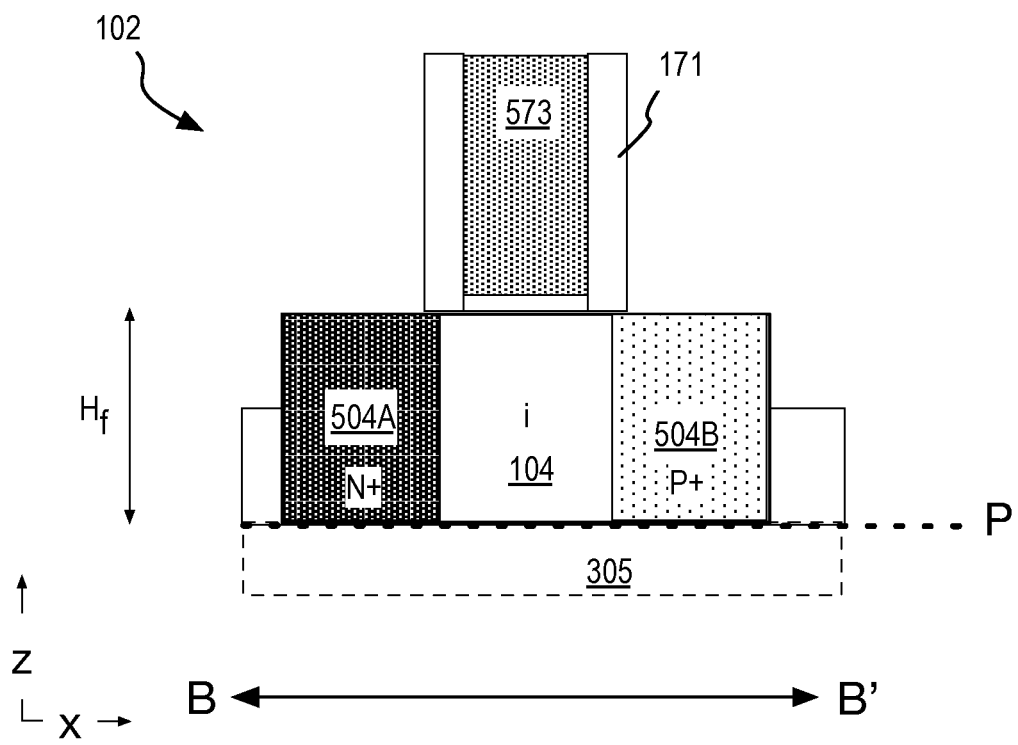

FIGS. 6A, 6B, 6C, 6D, and 6E are cross-sectional views of a diode along the B-B' plane denoted in FIG. 1 following the performance of selected operations of the methods 401, in accordance with some alternative embodiments in which end portions of a semiconductor body are regrown to form a diode. Referring again to FIG. 4, at operation 410, semiconductor bodies to be employed in a diode are regrow, for example using any epitaxy techniques known in the art, to form n-type and p-type semiconductor regions within opposite ends of the semiconductor body. In some embodiments further illustrated by FIGS. 5A and 5B, a gate stack is formed over a central portion of semiconductor body 104 prior to regrowing doped diode regions. For the illustrated embodiments, the gate stack is a mandrel including a sacrificial gate electrode 573, which may be a dielectric or polysilicon, for example. Spacer 171 is disposed on a sidewall of sacrificial gate electrode 573. End portions of semiconductor bodies not protected by the gate stack are then recess etched 610. In some embodiments, exposed ends of semiconductor body 104 are etched from the front side while semiconductor body 104 is disposed over back-side substrate 305. As shown in FIG. 6B, a first doped semiconductor may be epitaxially grown at a first end of the semiconductor body to form an n-type or p-type region, and then a second doped semiconductor may be epitaxially grown to form the complementary region at the opposite end of the semiconductor body. Epitaxy growth may be seeded from a surface of back-side substrate 305 and/or from sidewalls of the intrinsic portion of semiconductor 104 retained below sacrificial gate electrode 573. The semiconductor regrown may have the same majority lattice constituents as semiconductor 104 (e.g., Si) with only the addition of the dopant species. Alternatively, the semiconductor regrown may have different majority lattice constituents (e.g., SiGe) than semiconductor 104 (e.g., Si). Dopant levels in the regrown material may be very high (e.g., n+ and p+), or not (e.g., n− and p−) as a function of desired diode characteristics. One or two masking operations (not depicted) may be needed to first recess etch and then epitaxially regrow one or both ends of the semiconductor bodies.

As further shown in FIG. 6B, doped end lengths 504A (e.g., n+) and 504B (e.g., p+) extend through the entire semiconductor body height $H_f$ and intersect plane P. The front-side processing illustrated in FIG. 6B may again generate a lateral p-i-n structure rather than a p-n junction.

Figure 6C:
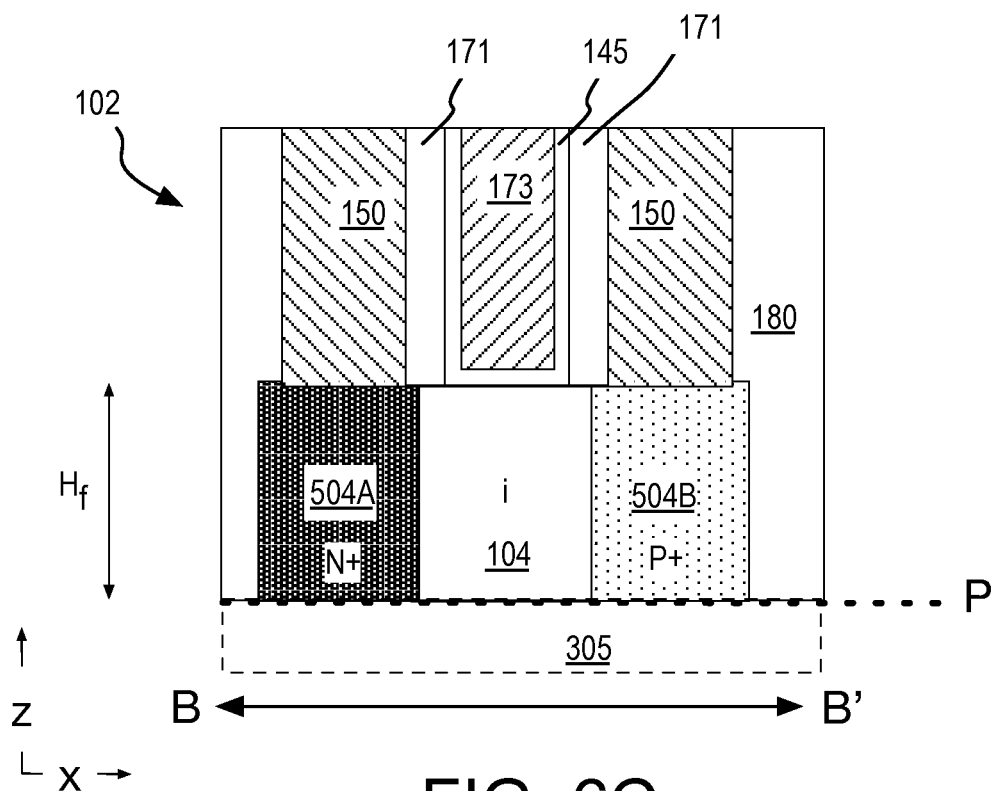
Figure 6D:
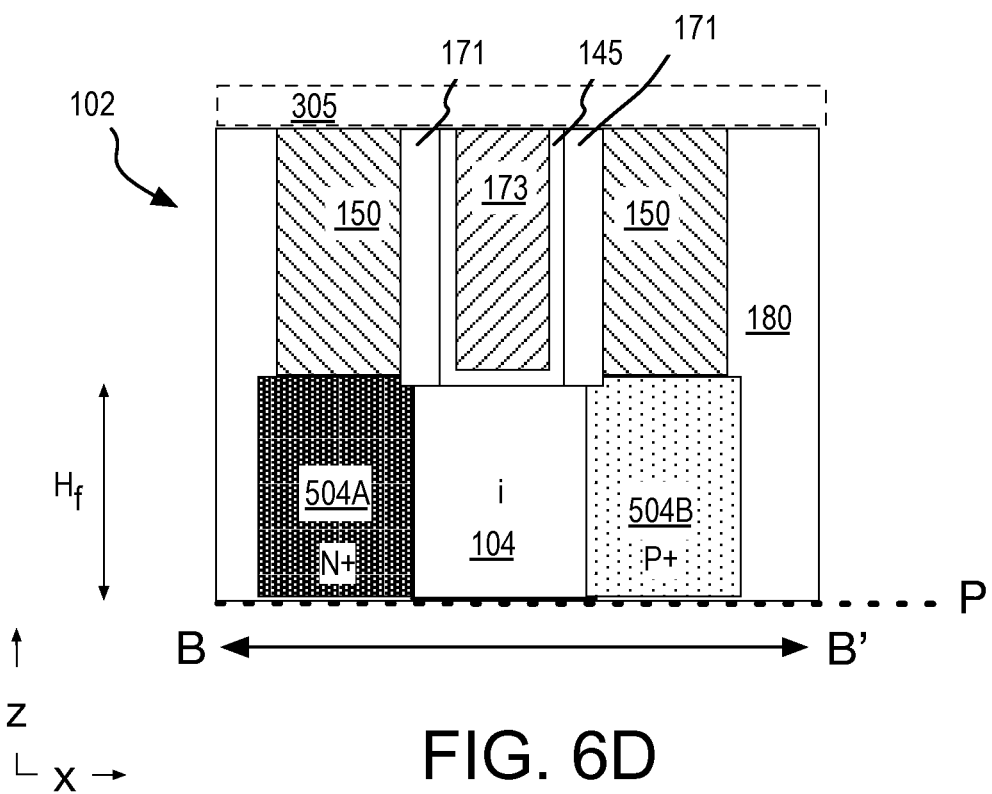
Figure 6E:
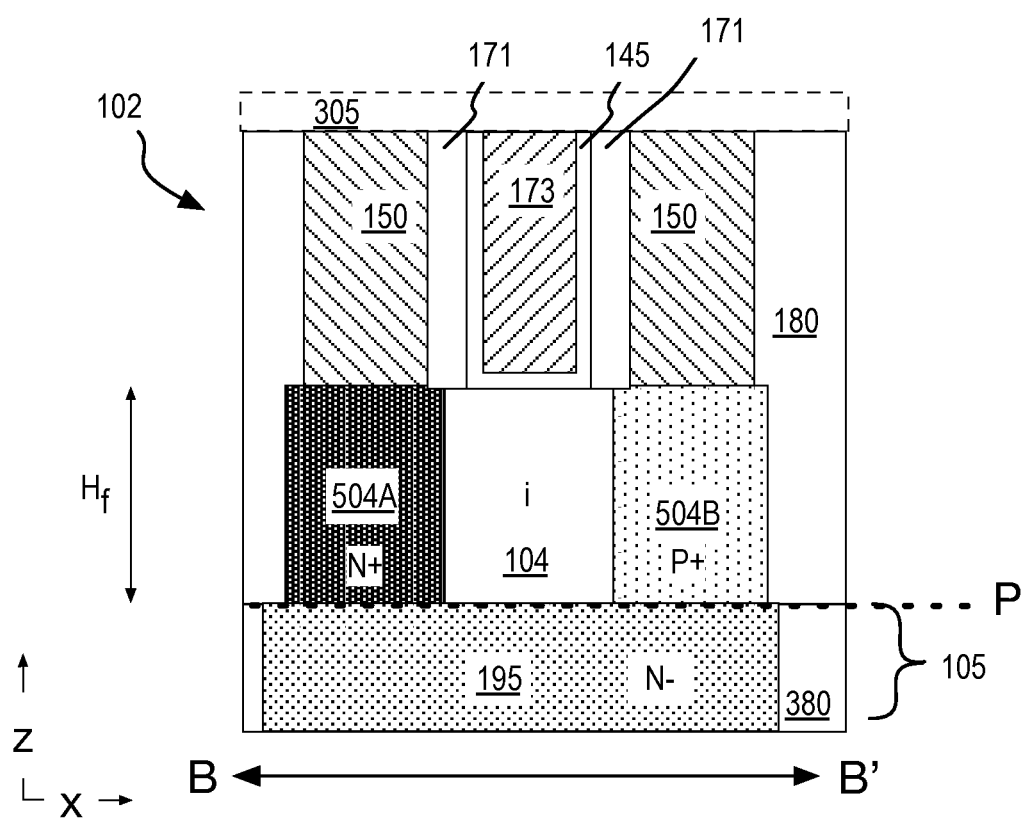

Returning to FIG. 4, methods 401 continue at operation 215 where front-side processing of the transistors is completed as described above. Operation 215 may also entail formation of doped-semiconductor terminals if the regrown material was lightly doped and front-side contact metallization. Where the semiconductor regrown at operation 210 was heavily doped, contact metallization may directly contact the regrown semiconductor. The doped-semiconductor terminals may be formed with any known impurity. As shown in FIG. 6C for example, front-side contact metallization 150 is formed, in direct contact with doped-semiconductor end lengths 504A and 504B. In some exemplary embodiments, front-side contact metallization 150 extends between a source or drain terminal of a transistor and one of the diode end lengths 504A and 504B, interconnecting the two. Contact metallization 150 may be any metal known to be suitable for the purpose and may be deposited by any known technique. As shown in FIG. 1 front-side contact metallization 150 straps across the plurality of semiconductor bodies 104, coupling one side of the p-n junction formed in each semiconductor body 104 in electrical parallel. Following front-side contact metallization, front-end processing of transistor and diodes is substantially complete. Any conventional backend interconnect fabrication may then be practiced to complete a front-side of the IC stratum.

Returning to FIG. 4, methods 401 continue to operation 220 where the backside of the non-planar semiconductor bodies is revealed. In some embodiments further illustrated in FIG. 6D, front-side stack 305 including any suitable carrier may be applied (e.g., bonded) to the uppermost front-side interconnect level. With the front side of the IC stratum mechanically supported, back-side substrate 305 may then be thinned into back-side stack 105 and/or replaced with back-side stack 105. Any known grind, and/or polish, and/or layer transfer process may be performed at operation 220. Once revealed, the back side of the semiconductor bodies of at least diode 102 are ready for back-side processing.

Methods 401 (FIG. 4) continue at operation 425 where doped semiconductor is deposited on the backside of the diode semiconductor body to interconnect the n-type and p-type end portions formed from the front-side processing. In the exemplary embodiment further illustrated in FIG. 6E, back-side stack 105 formed at operation 425 includes a dielectric material 380 and back-side diode interconnect 195 that is in contact with a back-side of both doped semiconductor body end lengths 504A, 504B. In some exemplary embodiments, back-side diode interconnect 195 includes single-crystalline semiconductor that is epitaxially grown from the backside of semiconductor body 104. The epitaxial semiconductor material advantageously extends over the entire longitudinal length of semiconductor body 104 and is in direct contact with both end lengths 504A, 504B. The epitaxial semiconductor material may be the same semiconductor as that of semiconductor body 104 (e.g., Si) to avoid formation of a heterojunction. The epitaxial semiconductor material grown may also be the same semiconductor as that of the regrown end portions 504A, 504B to avoid formation of a heterojunction. The epitaxial semiconductor material providing back-side diode interconnect 195 may be doped to either conductivity type such that the p-n junction is either at the interface of end length 504A or end length 504B (illustrated). In some advantageous embodiments, the doping level of the epitaxial semiconductor material providing back-side diode interconnect 195 has a lighter doping (e.g., n−) than that of the regrown end portions (e.g., 504A). Back-side diode interconnect 195 therefore wraps the diode structure around any portion of semiconductor body 104 that laterally separates the p-type and n-type regions. For example, back-side diode interconnect 195 may shunt the intrinsic semiconductor region disposed below any vestigial gate stack. Methods 401 (FIG. 4) then end at operation 235 where the IC device processing is completed following any known techniques.

Figure 7:
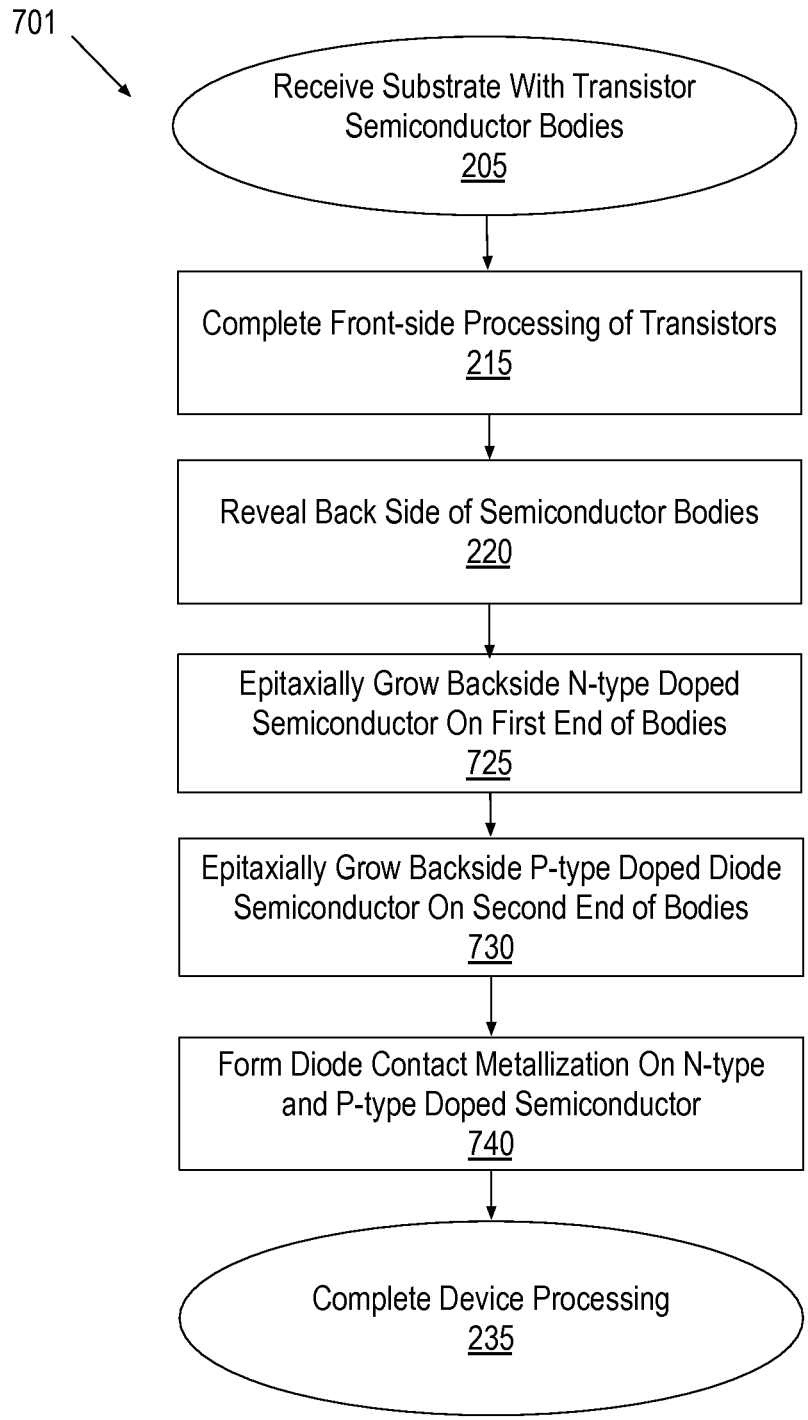
FIG. 7 is a flow diagram of methods for fabricating an IC, in accordance with some alternative embodiments.

FIG. 7 is a flow diagram of methods 701 for fabricating IC 100, in accordance with some alternative embodiments. FIGS. 8A, 8B, 8C, 8D, and 8E are cross-sectional views of a diode along the B-B' plane denoted in FIG. 1 following the performance of selected operations of the methods 701, in accordance with some embodiments. Referring first to FIG. 7, methods 701 begin at operation 205 where a substrate, upon which non-planar semiconductor bodies have been fabricated, is received as an input. Any of the non-planar semiconductor bodies described above in the context of methods 201, 401 may also be received as input to methods 701. In some exemplary embodiments represented by FIG. 8A, non-planar semiconductor body 104 received at operation 205 is uniformly lightly-doped (e.g., p−). The dopant level may be suitable for a channel region of an NMOS transistor, for example.

Figure 8A:
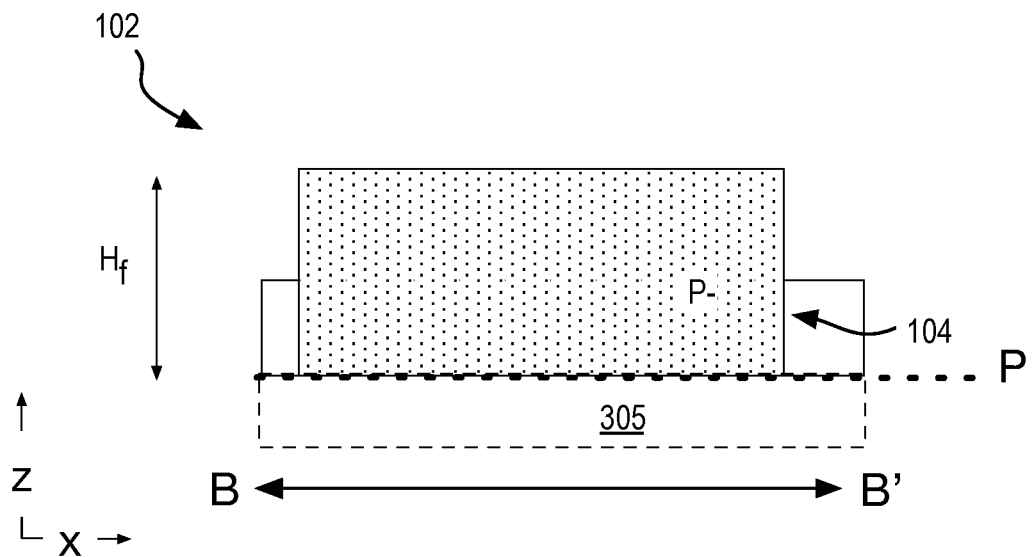
FIGS. 8A, 8B, 8C, 8D, and 8E are cross-sectional views of a diode along the B-B' plane denoted in FIG. 1 following the performance of selected operations of the methods illustrated in FIG. 7, in accordance with some embodiments.
Figure 8B:
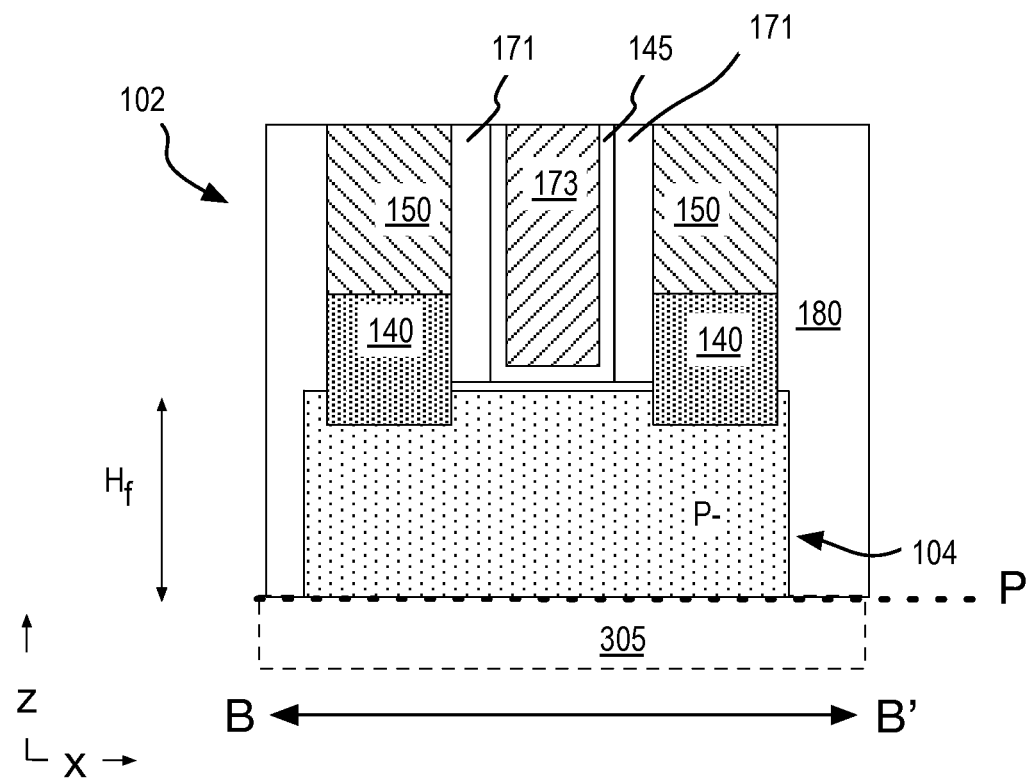
Figure 8C:
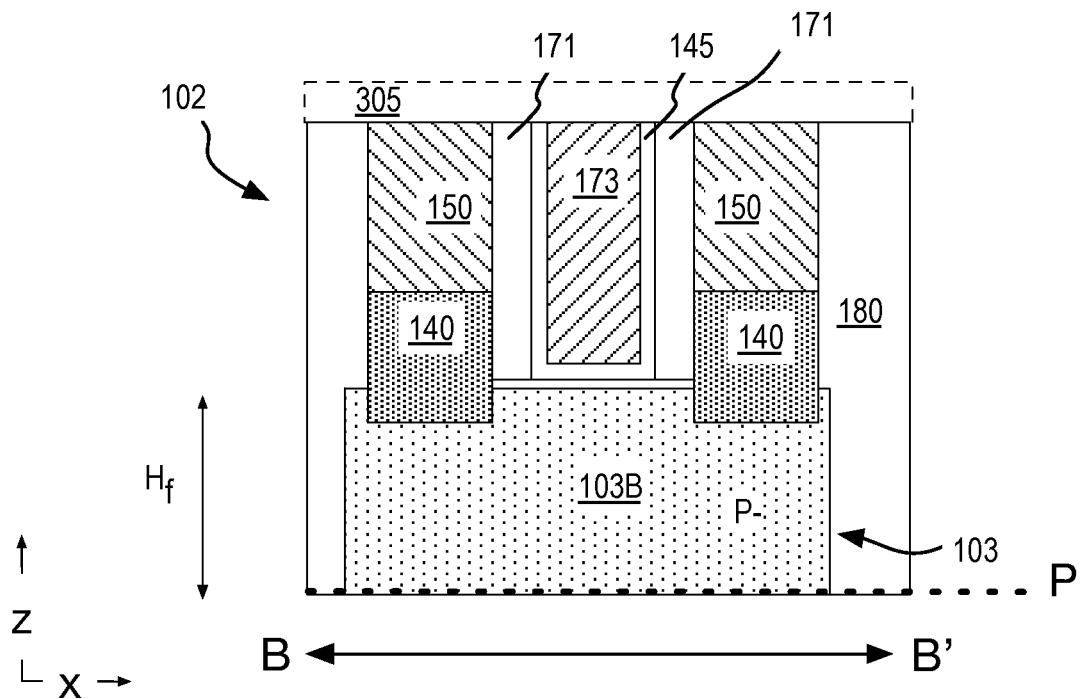
Figure 8D:
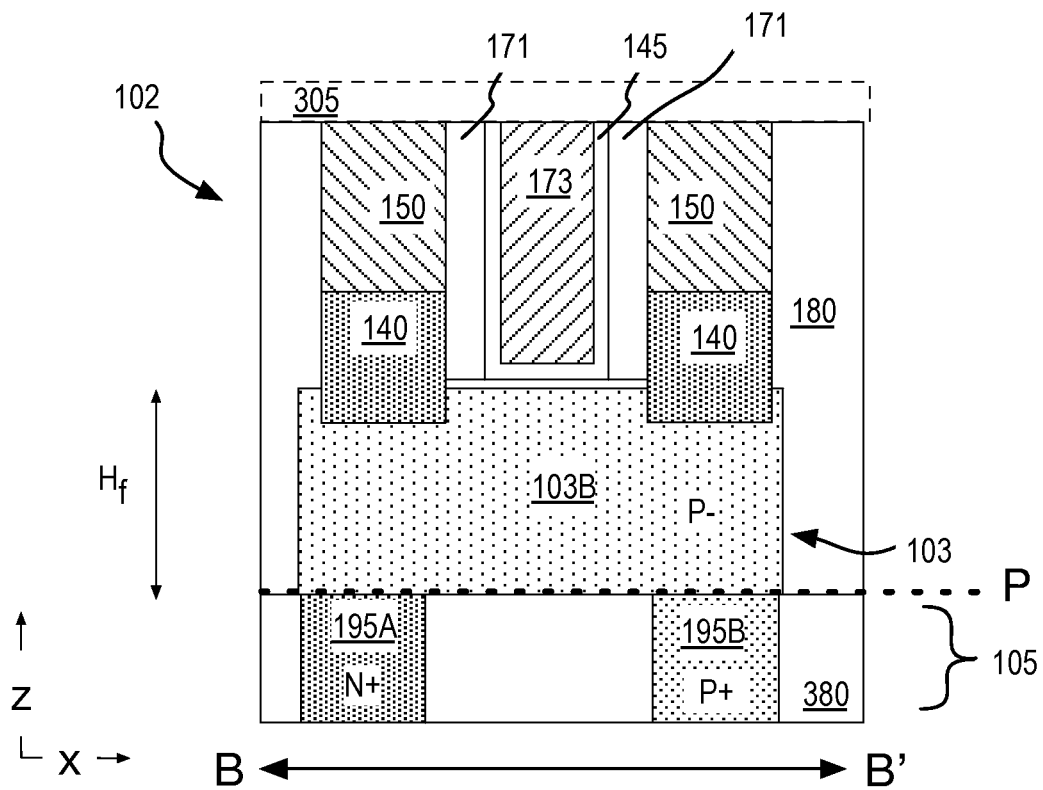
Figure 8E:
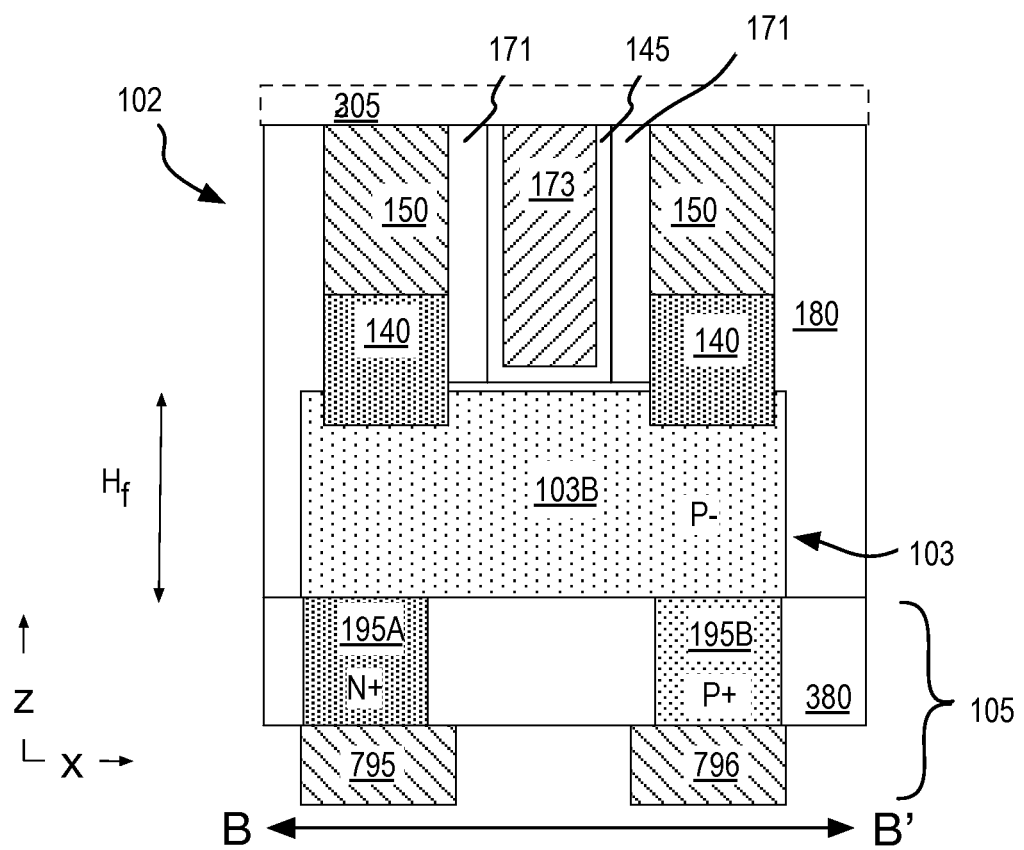

Methods 701 (FIG. 7) continue at operation 215 where front-side processing of the transistors is completed. Operation 215 may entail any known techniques for fabricating a FET gate stack and source/drain doped-semiconductor terminals. Such processing may be substantially as described above in the context of methods 201 and may also form front-side structures over the diode semiconductor bodies, for example as illustrated in FIG. 8B. Such front-side structures may be substantially non-functional in the context of semiconductor diodes and their presence merely indicative of the diode integration with transistor fabrication. Concurrently with transistor gate stack fabrication, a gate stack including gate dielectric 145 and gate electrode 173 may also be formed over semiconductor bodies of a semiconductor diode. Alternatively, semiconductor bodies of the diode may be masked during one or more of the front-side transistor processing operations, for example preventing formation of a non-operative gate stack over the diode semiconductor body.

While any gate stack materials known to be suitable for semiconductor bodies may be utilized at operation 215, in some exemplary embodiments the gate stack includes a high-k dielectric material (with a bulk relative permittivity greater than 9) and a metal gate electrode having a work function suitable for semiconductor bodies 103 (FIG. 1). Exemplary high-k materials include metal oxides, such as, but not limited to $Al_2O_3$, $HfO_2$, $HfAlO_x$. Silicates, such as, but not limited to $HfSiO_x$, or $TaSiO_x$ may also be suitable for some semiconductor body compositions (e.g., Si, Ge, SiGe, III-V). The gate electrode may advantageously have a work function below 5 eV and may include an elemental metal layer, a metal alloy layer, or laminate structure of either or both. In some embodiments the gate electrode is a metal nitride, such as TiN (e.g., 4.0-4.7 eV). The gate electrode may also comprise Al (e.g., TiAlN). Other alloy constituents may also be employed in the gate electrode, such as, but not limited to, C, Ta, W, Pt, and Sn.

In further embodiments, operation 215 also entails formation of doped-semiconductor terminals and front-side contact metallization. The doped-semiconductor terminals may be formed with any known impurity implantation and/or epitaxial regrowth of the doped-semiconductor terminals. The doped-semiconductor terminals formed at operation 215 include source and drain regions of the transistor. In further embodiments, diode terminals to ends of the lightly-doped diode semiconductor body are also formed at operation 215. In some exemplary embodiments illustrated in FIG. 8B, heavily-doped (n+) semiconductor 140 is formed at opposite ends of semiconductor body 104. In some exemplary embodiments, heavily-doped semiconductor 140 is epitaxially grown on one or more surface of each semiconductor body 104. Front-side contact metallization 150 is then formed, for example in direct contact with the doped-semiconductor terminals 140. Following front-side contact metallization, front-end processing of transistors and diodes is substantially complete. Any conventional backend interconnect fabrication may then be practiced to complete a front-side of the IC stratum.

Returning to FIG. 7, methods 701 continue to operation 220 where the backside of the non-planar semiconductor bodies is revealed. In some further embodiments further illustrated in FIG. 8C, front-side stack 305 including any suitable carrier may be applied (e.g., bonded) to the uppermost front-side interconnect level. With the front side of the IC stratum mechanically supported, back-side substrate 305 may then be thinned into back-side stack 105 and/or replaced with back-side stack 105. Any known grind, and/or polish, and/or layer transfer process may be performed at operation 220. Once revealed, the back side of the semiconductor bodies of at least diode 102 are ready for back-side processing.

Methods 701 (FIG. 7) continue at operation 725 where an n-type doped semiconductor is formed on the backside of the diode semiconductor body at a first end. At operation 730, p-type doped semiconductor is formed on the back side of the diode semiconductor body at a second end. The doped-semiconductor regions interconnect with the lightly-doped semiconductor body 104 formed by the front-side processing. In the exemplary embodiment further illustrated in FIG. 8D, back-side stack 105 formed at operation 725 includes a dielectric material 380 and back-side interconnect 195A, 195B in contact with the back side of separate end lengths of semiconductor body 104. In some exemplary embodiments, back-side diode interconnect 195A includes single-crystalline heavily-doped (e.g., n+) semiconductor that is epitaxially grown from the backside of semiconductor body 104. Likewise, back-side diode interconnect 195B may include single-crystalline heavily-doped (e.g., p+) semiconductor that is epitaxially grown from a different portion of the backside of semiconductor body 104. The epitaxial semiconductor material grown may be confined, for example by isolation dielectric 380. The epitaxial semiconductor material may be the same semiconductor as that of semiconductor body (e.g., Si) to avoid formation of heterojunctions. The epitaxial semiconductor materials having a doping complementary to that of semiconductor body 104 defines the p-n junction.

Methods 701 (FIG. 7) then continue at operation 740 where diode contact metallization to each of the n-type and p-type doped epitaxially semiconductor is further formed from the back side. Any suitable metals and metal patterning techniques may be performed at operation 740. In the example illustrated in FIG. 8E, back-side contact metallization 895, 896 is deposited directly on back-side diode interconnects 195A, 195B. Back-side contact metallization 895, 896 may strap across a plurality of semiconductor bodies providing the back-side diode interconnect 195A, 195B shown in FIG. 1 to couple one side of the p-n junction formed in each semiconductor body 104 in electrical parallel. In sole reliance of the back-side contact metallization, top-side metallization 150 may be non-functional for diode 102 as only an artifact of front-side transistor processing. Methods 701 (FIG. 7) then end at operation 235 where the IC device processing is completed following any known techniques.

Figure 9:
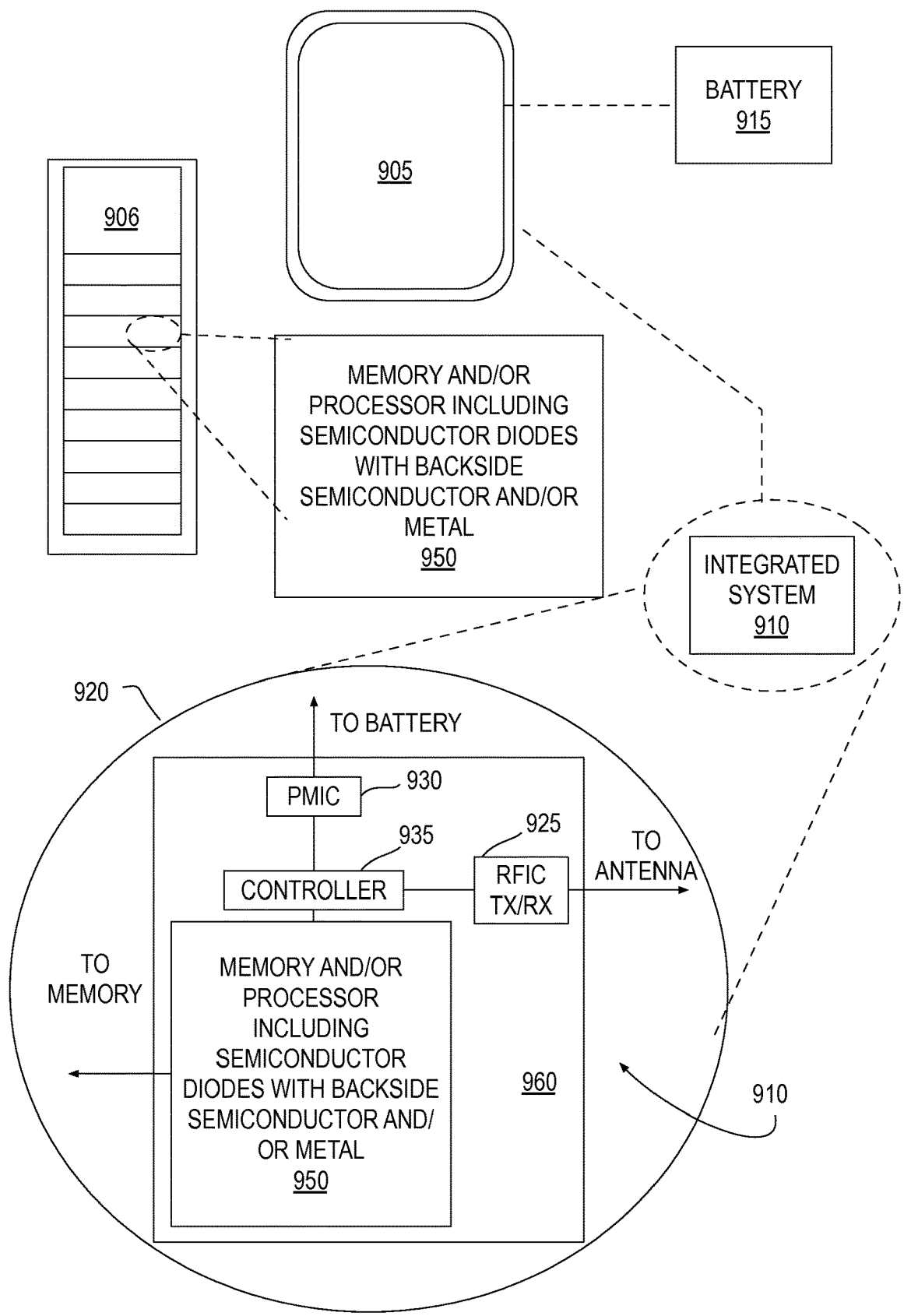
FIG. 9 illustrates a mobile computing platform and a data server machine employing an SoC having a plurality of FETs and diodes having architectures in accordance with one or more embodiments.

FIG. 9 illustrates a mobile computing platform and a data server machine employing a SoC having a plurality of FETs and diodes having architectures in accordance with one or more embodiments described elsewhere herein. The server machine 906 may be any commercial server, for example including any number of high-performance computing platforms disposed within a rack and networked together for electronic data processing, which in the exemplary embodiment includes a packaged monolithic SoC 950. The mobile computing platform 905 may be any portable device configured for each of electronic data display, electronic data processing, wireless electronic data transmission, or the like. For example, the mobile computing platform 905 may be any of a tablet, a smart phone, laptop computer, etc., and may include a display screen (e.g., a capacitive, inductive, resistive, or optical touchscreen), a chip-level or package-level integrated system 910, and a battery 915.

Either disposed within the integrated system 910 illustrated in the expanded view 920, or as a stand-alone packaged chip within the server machine 906, monolithic SoC 950 includes a memory block (e.g., RAM), a processor block (e.g., a microprocessor, a multi-core microprocessor, graphics processor, or the like) including at least one FET and diode having one or more of the features described elsewhere herein. The monolithic SoC 950 may be further coupled to a board, a substrate, or an interposer 960 along with, one or more of a power management integrated circuit (PMIC) 930, RF (wireless) integrated circuit (RFIC) 925 including a wideband RF (wireless) transmitter and/or receiver (TX/RX) (e.g., including a digital baseband and an analog front end module further comprises a power amplifier on a transmit path and a low noise amplifier on a receive path), and a controller 935.

Functionally, PMIC 930 may perform battery power regulation, DC-to-DC conversion, etc., and so has an input coupled to battery 915 and with an output providing a current supply to other functional modules. As further illustrated, in the exemplary embodiment, RFIC 925 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 4G, and beyond. In alternative implementations, each of these board-level modules may be integrated onto separate ICs or integrated into monolithic SoC 950.

Figure 10:
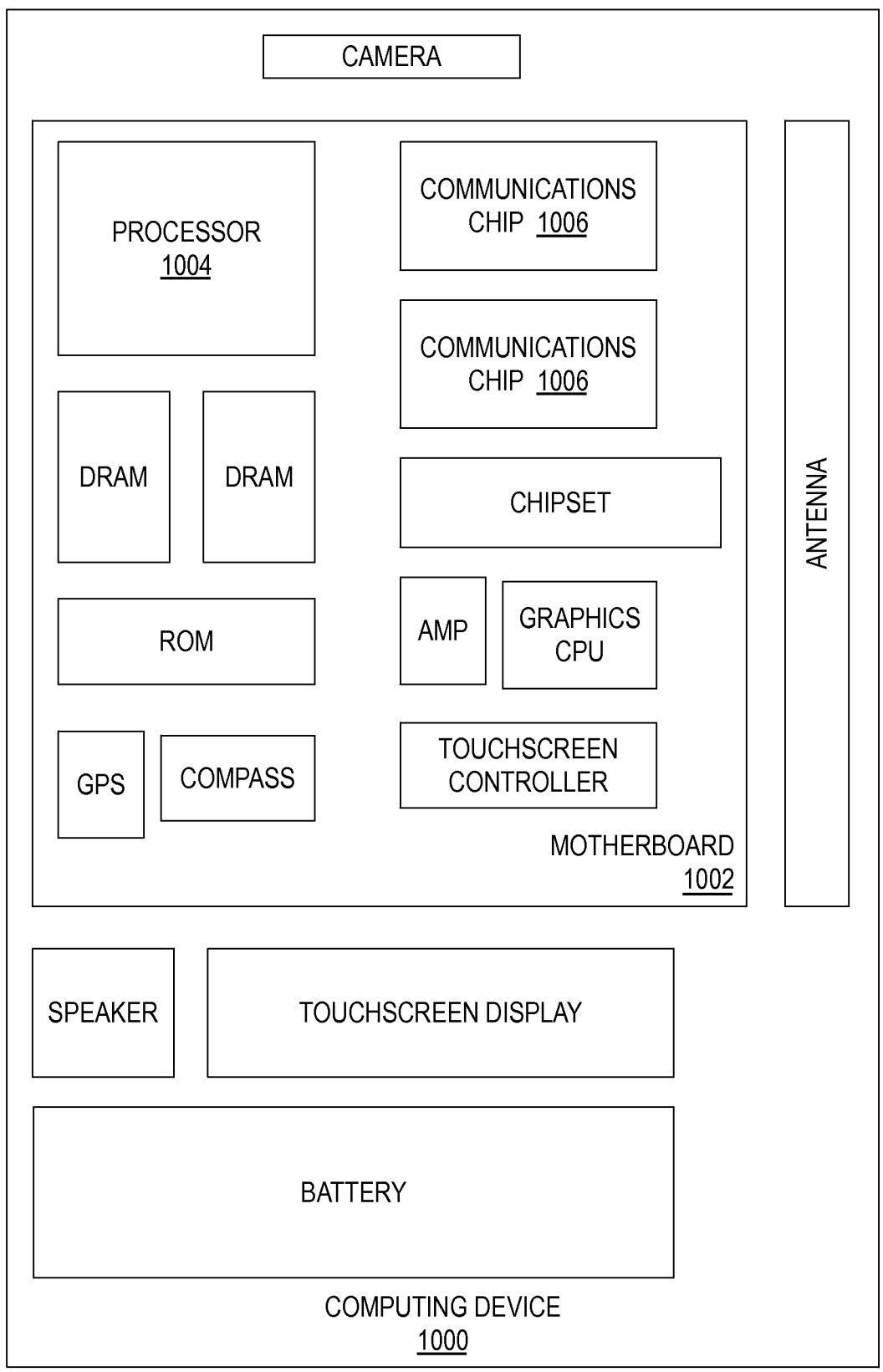
FIG. 10 is a functional block diagram of an electronic computing device, in accordance with some embodiments.

FIG. 10 is a functional block diagram of an electronic computing device, in accordance with some embodiments. Computing device 1000 may be found inside platform 905 or server machine 906, for example. Device 1000 further includes a motherboard 1002 hosting a number of components, such as, but not limited to, a processor 1004 (e.g., an applications processor), which may further incorporate at least one FET and diode having one or more of the features described elsewhere herein. Processor 1004 may be physically and/or electrically coupled to motherboard 1002. In some examples, processor 1004 includes an integrated circuit die packaged within the processor 1004. In general, the term "processor" or "microprocessor" may refer to any device or portion of a device that processes electronic data from registers and/or memory to transform that electronic data into other electronic data that may be further stored in registers and/or memory.

In various examples, one or more communication chips 1006 may also be physically and/or electrically coupled to the motherboard 1002. In further implementations, communication chips 1006 may be part of processor 1004. Depending on its applications, computing device 1000 may include other components that may or may not be physically and electrically coupled to motherboard 1002. These other components include, but are not limited to, volatile memory (e.g., DRAM), non-volatile memory (e.g., ROM), flash memory, a graphics processor, a digital signal processor, a crypto processor, a chipset, an antenna, touchscreen display, touchscreen controller, battery, audio codec, video codec, power amplifier, global positioning system (GPS) device, compass, accelerometer, gyroscope, speaker, camera, and mass storage device (such as hard disk drive, solid-state drive (SSD), compact disk (CD), digital versatile disk (DVD), and so forth), or the like.

Communication chips 1006 may enable wireless communications for the transfer of data to and from the computing device 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 1006 may implement any of a number of wireless standards or protocols, including but not limited to those described elsewhere herein. As discussed, computing device 1000 may include a plurality of communication chips 1006. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that principles of the disclosure are not limited to the embodiments so described, but can be practiced with modification and alteration without departing from the scope of the appended claims. For example the above embodiments may include specific combinations of features as further provided below.

In one or more first embodiments, an integrated circuit (IC), comprises a transistor including a one or more first non-planar semiconductor bodies further comprising a channel region. The IC comprises a semiconductor diode disposed laterally adjacent to the transistor and including one or more second non-planar semiconductor bodies further comprising at least one of a p-type doped region and an n-type doped region. The IC comprises a front-side interconnect level disposed over a front side of the first non-planar semiconductor bodies and coupled to at least one terminal of the transistor. The IC comprises a back-side interconnect level contacting a back side of at least the second non-planar semiconductor bodies and coupled to at least one terminal of the semiconductor diode.

In furtherance of the first embodiments, the second non-planar semiconductor bodies further comprise at least two semiconductor bodies, each having a vertical p-n junction with a p-type or n-type doping within a back-side portion of the semiconductor body, and complementary doping within a front-side portion of the semiconductor body.

In furtherance of the first embodiments immediately above, the vertical p-n junction spans the entire longitudinal length of the second semiconductor bodies, and the back-side interconnect level directly contacts the entire longitudinal length of the second semiconductor bodies.

In furtherance of the first embodiments immediately above, the back-side interconnect level further comprises a metal trace coupled to a back side of the second non-planar semiconductor bodies.

In furtherance of the first embodiments immediately above, the back-side interconnect level further comprises semiconductor that is doped to the same conductivity type as the back-side portion of the semiconductor bodies, and that is coupled to a back side of the second non-planar semiconductor bodies.

In furtherance of the first embodiments immediately above, the back-side interconnect level comprises polycrystalline semiconductor.

In furtherance of the first embodiments, the second non-planar semiconductor bodies comprise a p-type or n-type doping within a first longitudinal end length of the second non-planar semiconductor bodies, and a complementary doping within a second longitudinal end length of the second non-planar semiconductor bodies. The back-side interconnect level comprises epitaxial semiconductor doped to the same conductivity type as that of either the first or second longitudinal end length, and that directly contacts the first longitudinal end length and the second longitudinal end length.

In furtherance of the first embodiments immediately above, the back-side interconnect level directly contacts the entire longitudinal length of the second semiconductor bodies.

In furtherance of the first embodiments immediately above, the first and second longitudinal end lengths are separated by a lightly-doped or intrinsic region of the second non-planar semiconductor bodies that is electrically shunted by the back-side interconnect level.

In furtherance of the first embodiments immediately above, the transistor further comprises a source semiconductor and a drain semiconductor separated by the channel region, and a first gate electrode stack including a gate electrode and a gate dielectric disposed over at least a front side of the channel region. The diode further comprises a second gate stack disposed over the lightly-doped or intrinsic region of the second non-planar semiconductor bodies. The first and second gate stacks have substantially the same lateral dimensions. The transistor channel region has substantially the same lateral dimension as the lightly-doped or intrinsic region of the second non-planar semiconductor bodies.

In furtherance of the first embodiments immediately above, the front-side interconnect level further comprises diode contact metallization disposed over a front side of the second semiconductor bodies, opposite the back-side interconnect level.

In furtherance of the first embodiments immediately above, the diode contact metallization further comprises a first contact metal feature coupled to the first longitudinal end length, and a second contact metal feature coupled to the second longitudinal end length.

In furtherance of the first embodiments immediately above, the first and second contact metal features are laterally spaced apart by an intervening second gate stack disposed over the lightly-doped or intrinsic region of the second non-planar semiconductor bodies.

In one or more second embodiments, an integrated circuit (IC), comprises a transistor including a one or more first non-planar semiconductor bodies further comprising a channel region. The IC comprises a semiconductor diode disposed laterally adjacent to the transistor and including one or more second non-planar semiconductor bodies, the entirety of which are doped to p-type or n-type conductivity. The diode further comprises a back-side epitaxial p-type semiconductor in direct contact with a back side of a first end of the second non-planar semiconductor bodies, and a back-side epitaxial n-type semiconductor in direct contact with the back side of a second end of the second non-planar semiconductor bodies. The IC includes a front-side interconnect level disposed over a front side of the first non-planar semiconductor bodies and coupled to at least one terminal of the transistor, and a back-side interconnect level comprising a pair of metal contacts, a first of the pair coupled to the back-side epitaxial p-type semiconductor, and a second of the pair coupled to the back-side epitaxial n-type semiconductor.

In furtherance of the second embodiments, the entirety of the second non-planar semiconductor body is doped to same impurity level as the transistor channel region.

In furtherance of the second embodiments, the transistor further comprises a source semiconductor and a drain semiconductor separated by the channel region, a first gate electrode stack including a gate electrode and a gate dielectric disposed over at least a front-side of the channel region. The diode further comprises a second gate stack disposed over at least a front-side of the second non-planar semiconductor bodies, and positioned laterally between the back-side epitaxial p-type and n-type semiconductor.

In one or more third embodiments, a method of fabricating an integrated circuit (IC) comprises forming a transistor including one or more first non-planar semiconductor bodies disposed over a substrate. The method comprises forming a semiconductor diode laterally adjacent to the transistor, the diode including one or more second non-planar semiconductor bodies further comprising at least one of a p-type doped region and an n-type doped region. The method comprises forming a front-side interconnect level disposed over a front side of the first non-planar semiconductor bodies and coupled to at least one terminal of the transistor. The method comprises exposing a back side of at least the second non-planar semiconductor bodies by thinning or removing the substrate. The method comprises forming a back-side interconnect level in contact with the back side of the second non-planar semiconductor bodies and coupled to at least one terminal of the semiconductor diode.

In furtherance of the third embodiments, forming the semiconductor diode further comprises implanting a p-type or n-type impurity into a back-side portion of a longitudinal length of the second semiconductor bodies, implanting a complementary doping into a front-side portion of a longitudinal length of the second semiconductor bodies. Forming the back-side interconnect level further comprises forming back-side diode contact metallization coupled to the back-side portion of the second semiconductor bodies.

In furtherance of the third embodiments immediately above, forming the front-side interconnect level further comprises forming second diode contact metallization coupled to the front-side portion of the second semiconductor bodies, the second diode contact metallization including a pair of metal contacts disposed on either side of an intervening gate stack.

In furtherance of the third embodiments, forming the back-side interconnect level further comprises depositing heavily-doped semiconductor on the back side of the second semiconductor bodies, and depositing the back-side diode contact metallization in contact with the heavily-doped semiconductor.

In furtherance of the third embodiments, forming the semiconductor diode further comprises forming a gate stack over at least a front side of the second non-planar semiconductor bodies. Forming the diode further comprises implanting, from the front side, n-type impurities into a first longitudinal end length of the second non-planar semiconductor bodies, and p-type impurities into a second longitudinal end length of the second non-planar semiconductor bodies, wherein the first and second end lengths are laterally separated by the gate stack. Forming the back-side interconnect level further comprises epitaxially growing semiconductor doped with either n-type or p-type impurities over a longitudinal length of the second non-planar semiconductor bodies that spans the n-type and p-type implanted regions.

In furtherance of the third embodiments, the method further comprises forming a pair of contacts landing on at least a front-side of the second semiconductor bodies, the pair including a first contact coupled to the first longitudinal end length and a second contact coupled to the second longitudinal end length.

In furtherance of the third embodiments, forming the semiconductor diode further comprises epitaxially growing n-type doped semiconductor on a back side of a first end of the second semiconductor bodies, epitaxially growing p-type doped semiconductor on the back side of a second end of the second semiconductor bodies. Forming the back-side interconnect level comprises forming a metal contact on the back-side epitaxial p-type semiconductor, and forming a metal contact on the back-side epitaxial n-type semiconductor.

However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. An integrated circuit (IC), comprising:
    a fin transistor structure including one or more first non-planar semiconductor bodies further comprising a channel region having a first conductivity type and a first impurity concentration;
    a fin diode structure laterally adjacent to the transistor structure and including one or more second non-planar semiconductor bodies having the first conductivity type and the first impurity concentration, wherein the diode structure further comprises:
        a back-side p-type semiconductor in direct contact with a back side of a first end of the second semiconductor bodies; and
        a back-side n-type semiconductor in direct contact with the back side of a second end of the second semiconductor bodies;
    a front-side interconnect level over a front side of the first semiconductor bodies and coupled to at least one terminal of the fin transistor structure; and
    a back-side interconnect level comprising a pair of metal contacts, a first of the pair in direct contact with the back-side p-type semiconductor, and a second of the pair in direct contact with the back-side n-type semiconductor.

2. The IC of claim 1, wherein:
    the transistor structure further comprises:
        a source semiconductor and a drain semiconductor separated by the channel region;
        a first gate electrode stack including a gate electrode and a gate dielectric over at least a front-side of the channel region; and
    the diode structure further comprises a second gate stack over at least a front-side of the second semiconductor bodies, and positioned laterally between the back-side p-type and n-type semiconductor.

3. The IC of claim 1, wherein an impurity concentration of the back-side p-type semiconductor and of the back-side n-type semiconductor is higher than the first impurity concentration.

4. The IC of claim 1, wherein the first and second semiconductor bodies, the back-side p-type semiconductor, and back-side n-type semiconductor comprise silicon.

5. The IC of claim 1, wherein the first and second semiconductor bodies are single crystalline.

6. The IC of claim 5, wherein the back-side p-type semiconductor and back-side n-type semiconductor are single crystalline.

7. A method of fabricating an integrated circuit (IC), the method comprising:
    forming a fin transistor structure including one or more first semiconductor bodies over a substrate, and further comprising a channel region having a first conductivity type and a first impurity concentration;
    forming a fin diode structure laterally adjacent to the fin transistor structure, wherein the fin diode structure comprises one or more second non-planar semiconductor bodies having the first conductivity type and the first impurity concentration;
    forming a front-side interconnect level over a front side of the fin transistor structure and the fin diode structure, forming the front-side interconnect level further comprising forming a front-side contact coupled to the front-side portion of the second semiconductor bodies;
    exposing a back side of at least the second semiconductor bodies by thinning or removing the substrate;
    forming a back-side p-type semiconductor in direct contact with the back side of a first end of the second semiconductor bodies;
    forming a back-side n-type semiconductor in direct contact with the back side of a second end of the second semiconductor bodies; and
    forming a back-side interconnect level in contact with the back-side portion of the second semiconductor bodies, wherein forming the back-side interconnect level comprise forming a pair of metal contacts, a first of the pair in direct contact with the back-side p-type semiconductor, and a second of the pair in direct contact with the back-side n-type semiconductor.

8. The method of claim 7, wherein forming the front-side contact further comprises forming a pair of metal contacts on either side of an intervening gate stack that is over a portion of the second semiconductor bodies.

9. The method of claim 7, wherein forming the back-side interconnect level further comprises depositing contact metallization in contact with the back-side p-type semiconductor and with the back-side n-type semiconductor.

10. The method of claim 7, wherein:
    forming the back-side p-type semiconductor further comprises forming the back-side p-type semiconductor with an impurity concentration exceeding the first impurity concentration; and
    forming the back-side n-type semiconductor further comprises forming the back-side n-type semiconductor with an impurity concentration exceeding the first impurity concentration.

11. The method of claim 7, wherein the first and second semiconductor bodies are single crystalline, and wherein forming the back-side p-type semiconductor and forming the back-side n-type semiconductor further comprises epitaxially growing single-crystalline material.

12. The method of claim 7, wherein forming the back-side p-type semiconductor and forming the back-side n-type semiconductor further comprises forming a material comprising silicon.

* * * * *